United States Patent
Hayashi et al.

(10) Patent No.: US 6,808,964 B2
(45) Date of Patent: Oct. 26, 2004

(54) METHOD OF MANUFACTURING A SEMICONDUCTOR DEVICE AND LIQUID CRYSTAL DISPLAY

(75) Inventors: Masami Hayashi, Hyogo (JP); Ichiro Murai, Nagano (JP)

(73) Assignees: Mitsubishi Denki Kabushiki Kaisha, Tokyo (JP); Seiko Epson Corporation, Tokyo (JP)

(*) Notice: Subject to any disclaimer, the term of this patent is extended or adjusted under 35 U.S.C. 154(b) by 0 days.

(21) Appl. No.: 10/366,324

(22) Filed: Feb. 14, 2003

(65) Prior Publication Data

US 2003/0155571 A1 Aug. 21, 2003

Related U.S. Application Data

(62) Division of application No. 09/730,006, filed on Apr. 10, 2001, now abandoned.

(30) Foreign Application Priority Data

Dec. 13, 1999 (JP) .......................................... 11-352837

(51) Int. Cl.$^7$ .............................................. H01L 21/00
(52) U.S. Cl. ......................... 438/149; 438/96; 438/155; 438/163; 438/164; 438/153
(58) Field of Search .......................... 438/149, 96, 155, 438/163, 164, 153; 257/66, 59, 72; 349/42, 43, 46

(56) References Cited

U.S. PATENT DOCUMENTS

| | | | | |
|---|---|---|---|---|
| 5,292,675 A | * | 3/1994 | Codama ....................... | 437/44 |
| 5,668,019 A | * | 9/1997 | Kobayashi et al. .......... | 438/163 |
| 5,741,732 A | * | 4/1998 | Tikhonov .................... | 438/149 |
| 5,767,930 A | * | 6/1998 | Kobayashi et al. ........... | 349/42 |
| 6,037,195 A | * | 3/2000 | Toriyama et al. ........... | 438/149 |
| 6,207,995 B1 | | 3/2001 | Gardner et al. | |
| 6,225,150 B1 | * | 5/2001 | Lee et al. .................... | 438/153 |
| 6,403,409 B1 | * | 6/2002 | You ............................ | 438/164 |
| 6,534,788 B1 | * | 3/2003 | Yeo et al. ..................... | 257/72 |
| 2002/0098635 A1 | * | 7/2002 | Zhang et al. ............... | 438/199 |
| 2003/0155616 A1 | * | 8/2003 | Ohtani et al. ............... | 257/350 |

FOREIGN PATENT DOCUMENTS

| | | | |
|---|---|---|---|
| EP | 0 502 749 A2 | | 9/1992 |
| JP | 1-125866 | * | 5/1989 |
| JP | 2-181963 | * | 7/1990 |
| JP | 4-260336 | * | 9/1992 |
| JP | 3-356299 | | 4/1994 |
| JP | 6-140421 | * | 5/1994 |
| JP | 6-301056 | | 10/1994 |
| JP | 7-211913 | | 8/1995 |
| JP | 2000-31496 | * | 1/2000 |
| JP | 2001-250955 | * | 9/2001 |

* cited by examiner

*Primary Examiner*—Nathan J. Flynn
*Assistant Examiner*—Ahmed N. Sefer
(74) *Attorney, Agent, or Firm*—Leydig, Voit & Mayer, Ltd.

(57) ABSTRACT

A method of manufacturing a semiconductor device including: forming a semiconductor film on a substrate; forming an insulating film on the semiconductor film; forming a conductive film on the insulating film; forming a resist film, which has a sidewall, on the conductive film; forming a gate electrode which has a sidewall inside of the sidewall of the resist film by partially removing the conductive film by etching, using the resist film as a mask; forming a gate insulating film which includes an extended part having a sidewall positioned beyond the sidewall of the gate electrode by partially removing the insulating film by etching, using the resist film as a mask; forming high impurity concentration source and drain regions in regions of the semiconductor film spaced apart from the sidewall of said extended part by injecting impurities into the semiconductor film, using the resist film as a mask; removing the resist film; and forming, after removing the resist film, low impurity concentration regions in the source and drain regions, of which the impurity concentration is relatively lower than that of the high impurity concentration source and drain regions, in regions of the semiconductor film positioned beneath the extended part by injecting impurities into the semiconductor film, using the gate electrode as a mask.

15 Claims, 21 Drawing Sheets

DRIVE CIRCUIT REGION | DISPLAY PIXEL REGION

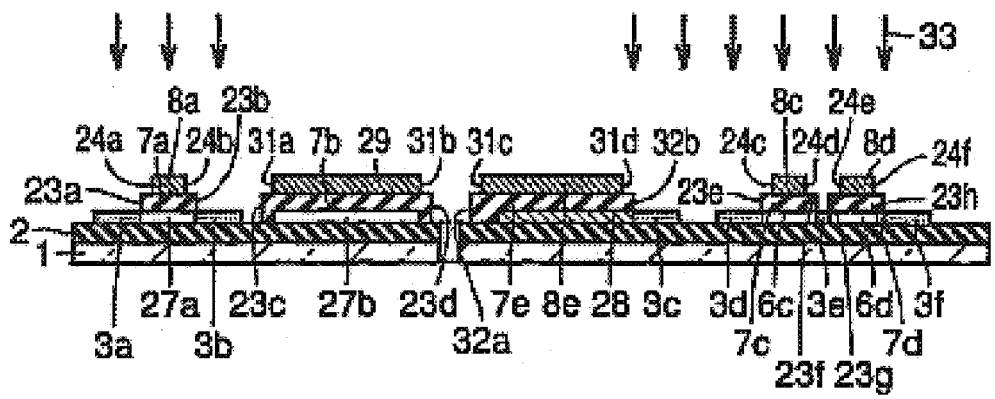

METHOD OF MANUFACTURING A SEMICONDUCTOR DEVICE AND LIQUID CRYSTAL DISPLAY

This disclosure is a division of U.S. patent application Ser. No. 09/730,006 filed Apr. 10, 2001, now abandoned.

BACKGROUND OF THE INVENTION

1. Field of the Invention

This invention relates to a semiconductor device, a liquid crystal display device, a process for a semiconductor device and a process for a liquid crystal display device, in particular to a semiconductor device, a liquid crystal display device, a process for a semiconductor device and a process for a liquid crystal display device which include field effect transistors having an LDD (Lightly Doped Drain) structure.

2. Description of the Background Art

Conventionally, a liquid crystal display device, which utilizes thin film field effect transistors formed on a glass substrate, has been known as one of liquid crystal display devices. A glass substrate where thin film field effect transistors are formed in such a liquid crystal display device is shown in FIG. 47. FIG. 47 is a cross section diagram showing a conventional liquid crystal display device. Referring to FIG. 47, a liquid crystal display device is described.

Referring to FIG. 47, an n type thin film field effect transistor 119 and a p type thin film field effect transistor 120 are formed in a drive circuit region on a glass substrate 101 in a liquid crystal display device. In addition, a capacitor 121 and a thin film field effect transistors 122 for a pixel are formed in a display pixel region.

In the drive circuit region, a base film 102 is formed on the glass substrate 101. A silicon oxide film is used for this base film n$^+$ type impurity regions 103a, 103b, n$^-$ type impurity regions 104a, 104b and a channel region 106a are formed on the base film 102 by using the same semiconductor film. A gate insulating film 107a is formed on the channel region 106a. A gate electrode 108a is formed on the gate insulating film 107a. The source/drain regions are formed of n$^+$ type impurity regions 103a, 103b and n$^-$ type impurity regions 104a, 104b. The n type thin film field effect transistor 119 is formed of those n$^+$ type impurity regions 103a, 103b, n$^-$ type impurity regions 104a, 104b, channel region 106a, gate insulating film 107a and gate electrode 108a.

In addition, p type impurity regions 105a, 105b and a channel region 106b are formed on the base film 102 by using the same semiconductor film. A gate insulating film 107b is formed on the channel region 106b. A gate electrode 108b is formed on the gate insulating film 107b. A p type thin film field effect transistor 120 is formed of those p type impurity regions 105a, 105b, channel region 106b, gate insulating film 107b and gate electrode 108b. An interlayer insulating film 110 is formed on those n type thin film field effect transistor 119 and p type thin film field effect transistor 120. In the regions located above the n$^+$ type impurity regions 103a, 103b and the p type impurity regions 105a, 105b, contact holes 111a to 111d are formed in the interlayer insulating film 110. Metal wires 112a to 112d are formed so as to extend from the inside of the contact holes 111a to 111d to the upper surface of the interlayer insulating film 110. A passivation film (not shown) is formed on the metal wires 112a to 112d. A flatting film 113 is formed on the passivation film.

In the display pixel region, a capacitor electrode 109 is formed on the base film 102. Another capacitor electrode 108e is formed above the capacitor electrode 109 via an insulating film 107e as the dielectric film. A capacitor 121 is formed of these capacitor electrodes 109, 108e and insulating film 107e. An n$^+$ type impurity region 103c is formed, as the conductive region, on the base film 102 so as to adjoin the capacitor electrode 109. In addition, n$^+$ type impurity regions 103d to 103f, n$^-$ type impurity regions 104d to 104g and channel regions 106c, 106d are formed on the base film 102 by using the same semiconductor film. Gate insulating films 107c, 107d are formed on the channel regions 106c, 106d, respectively. Gate electrodes 108c and 108d are formed on the gate insulating films 107c, 107d, respectively. In this way, one thin film field effect transistor is formed of the n$^+$ type impurity regions 103d, 103e, the n$^-$ type impurity regions 104d, 104e, the channel region 106c, the gate insulating film 107c and the gate electrode 108c. In addition, another thin film field effect transistor is formed of the n$^+$ type impurity regions 103e, 103f, the n$^-$ type impurity regions 104f, 104g, the channel region 106d, the gate insulating film 107d and the gate electrode 108d. The thin film field effect transistors 122 for pixels include those two thin film field effect transistors.

An interlayer insulating film 110 is formed on the capacitor 121 and the thin film field effect transistors 122 for a pixel. In the regions located above the n$^+$ type impurity regions 103c, 103d and 103f, contact holes 111e to 111g are formed in the interlayer insulating film 110. Metal wires 112e and 112f are formed so as to extend from the inside of the contact holes 111e to 111g to the upper surface of the interlayer insulating film 110. A passivation film (not shown) is formed on the metal wires 112e and 112f. A flatting film 113 is formed on the passivation film. In the region located above the metal wire 112e, a contact hole 114 is formed in the flatting film 113 and the passivation film. A pixel electrode 115 is formed so as to extend from the inside of the contact hole 114 to the upper surface of the flatting film 113 by using ITO or the like.

FIGS. 48 to 51 are cross section diagrams for describing a process for the liquid crystal display device as shown in FIG. 47. Referring to FIGS. 48 to 51, a process for a liquid crystal display device is described.

First, a base film 102 such as a silicon oxide film is formed on a glass substrate 101. An amorphous silicon film is formed on this base film 102. A polysilicon film is formed by annealing this amorphous silicon film using a laser or the like. A resist film is formed on this polysilicon film. A channel pattern is formed by carrying out an exposure to light and development processing on this resist film. Then, by using, as a mask, the resist film where the channel pattern is formed, the polysilicon film is etched so as to form polysilicon films 127a to 127c (see FIG. 48) and polysilicon film to be a capacitor electrode. After that, the resist film is removed. By implanting conductive impurities into the polysilicon film to be the capacitor electrode, a conductive film 128 (see FIG. 48) is formed. An insulating film to be a gate insulating film is formed on the polysilicon films 127a to 127c and the conductive film 128. A conductive film is formed on this insulating film. A resist film is formed on this conductive film. A gate pattern is formed in the resist film by carrying out exposure to light and development processing. By using, as a mask, the resist film where the gate pattern is formed, gate electrodes 108a to 108d (see FIG. 48) and a capacitor electrode 108e (see FIG. 48) are formed by carrying out wet etching. After that, the resist film is removed. Then, by using the gate electrodes 108a to 108d and the capacitor electrode 108e as a mask, the insulating film is etched so as to form the gate insulating film 107a to 107b (see FIG. 48) and the insulating film 107e (see FIG. 48) as the dielectric film. In this way, a structure as shown in FIG. 48 is gained.

After that, as shown in FIG. 49, a resist film 130b is formed so as to cover the region where the p type thin film field effect transistor 120 (see FIG. 47) is to be formed and at the same time resist film 130a, 130c and 130d is formed which becomes a mask for forming the n⁺ type impurity regions 103a to 103f. Then, phosphorus (P) ions 133 as impurity ions are implanted into predetermined regions in the polysilicon films 127a to 127c (see FIG. 48). In this manner, the n⁺ type impurity regions 103a to 103f are formed. After that, the resist films 130a to 130d are removed.

Next, as shown in FIG. 50, phosphorous ions 134 are implanted into predetermined regions under the condition where no resist film exists and, thereby, n⁻ type impurity regions 104a, 104b, 104d to 104g are formed.

Next, as shown in FIG. 51, resist films 135a to 135c are formed in the regions other than the regions where the p type thin film field effect transistor 120 (see FIG. 47) is to be formed. Then, boron (B) ions 136 are implanted by using the gate electrode 108b as a mask and, thereby, p type impurity regions 105a, 105b and channel region 106b are formed. After that, the resist films 135a to 135c are removed.

After this, an interlayer insulating film 110 (see FIG. 47) is formed. A resist pattern is formed on this interlayer insulating film 110. The interlayer insulating film 110 is partially etched and removed by using this resist pattern as a mask and, thereby, contact holes 111a to 111g (see FIG. 47) are formed. After that, the resist pattern is removed. Then, after carrying out a cleaning process, a metal layer which is processed to become metal wires 112a to 112f is formed so as to extend from the inside of the contact holes 111a to 111g to the upper surface of the interlayer insulating film 110. A resist pattern is formed on this metal layer. The metal film is partially removed by carrying out wet etching using this resist pattern as a mask. In this manner, the metal wires 112a to 112f (see FIG. 47) are formed. After that, the resist pattern is removed. A passivation film 113 (see FIG. 47) is formed on the metal wires 112a to 112f. After flatting the upper surface of the passivation film 113, a contact hole 114 (see FIG. 47) is formed in this passivation film 113. A transparent conductive film is formed so as to extend from the inside of the contact hole 114 to the upper surface of the passivation film 113. A resist film wherein a pixel pattern is formed on this transparent conductive film. By using this resist film as a mask the transparent conductive film is partially removed through wet etching so as to form a pixel electrode 115 (see FIG. 47). After that, the resist film is removed.

In this manner, a liquid crystal display device as shown in FIG. 47 can be gained.

In the conventional process for a liquid crystal display device as described above, the problem arises as follows. That is to say, in the step as shown in FIG. 49, the positions or the size of the n⁻ type impurity regions 104a, 104b (see FIG. 50) vary depending in the relative positioning relationship with the resist film 130a and the gate electrode 108a when noticing, for example, the region in which the n type thin film field effect transistor 119 (see FIG. 47) is to be formed. This point is described in more detail referring to FIGS. 52 and 53.

FIGS. 52 and 53 are diagrams for describing a conventional problem, which are partially enlarged cross section diagrams of the region wherein a resist film 130a is formed in the step as shown in FIG. 49.

Referring to FIG. 52, in the case that the relative positional relationship is shifted from the set position between the gate electrode 108a and the resist film 130a (the position of the resist film 130a is shifted either to the right or to the left), the respective sizes of the finally formed n⁻ type impurity regions 104a and 104b vary as shown in FIG. 52. In this manner, in the case that the sizes of the n⁻ type impurity regions 104a and 104b on the right and on the left are different, the electric property of the formed n type thin film field effect transistor 119 fluctuates from the designed value and, as a result, the problem arises in that the reliability of the liquid crystal display device is lowered.

In addition, as shown in FIG. 53, in the case that the distance W1 between the sidewall of the gate electrode 108a and the sidewall of the resist film 130a becomes small with respect to the necessary width W0 of the n type impurity regions 104a, 104b, the resultant width of the n type impurity regions 104a, 104b becomes smaller than the designed value. As a result of this, the electric property of the n type thin film field effect transistor becomes different form the designed value. As a result, in the same manner as the above described case, there are some cases where the reliability of the formed liquid crystal display device is lowered.

In addition, it is considered to introduce the step of carrying out an implantation of phosphorous ions 133 in order to form the n⁺ type impurity regions 103a, 103b under the condition where the insulating film 137 which is processed to be a gate insulating film is not removed but rather extends to the n⁺ type impurity regions 103a, 103b at the time of forming a thin film field effect transistor as shown in FIG. 54. Here, FIG. 54 is another diagram for describing the conventional problem. In the case that such a step is carried out, however, the same problem as the above described problem occurs. In addition, under the condition where the insulating film 137 remains as in the above, phosphorous ions 133 need to reach the regions in which n⁺ type impurity regions 103a, 103b are to be formed by passing through the insulating film 137 and, therefore, the implantation energy of phosphorous ions 133 needs to be made larger, which causes the case where the resist film 130a is changed in quality through this implantation of phosphorous ions. In some cases the resist film 130a, which has been changed in quality in this manner, partially remains without being removed in the removal step of this resist film 130a. In the case that the resist film 130a remains in this manner, defects are caused such that a predetermined structure cannot be formed because of the resist film 130a which has remained in place during the following process steps, which consequently lowers the reliability of the liquid crystal display device and which lowers the yield.

SUMMARY OF THE INVENTION

This invention is provided to solve such a problem and one purpose of this invention is to provide a semiconductor device which has a high reliability and a method for the same.

Another purpose of this invention is to provide a liquid crystal display device which has a high reliability and a method for the same.

A semiconductor device according to the one aspect of this invention includes a substrate, a semiconductor film, a gate insulating film and a gate electrode. The semiconductor film is formed on the main surface of the substrate and includes the source and drain regions adjoining each other via the channel region. The gate insulating film is formed on the channel region. The gate electrode is formed on the gate insulating film and has sidewall. The gate insulating film includes an extended part which has sidewall located outside of the sidewall of the gate electrode. One of the source and drain regions include a high concentration impurity region and a low concentration impurity region of which the impurity concentration is relatively lower than this high concentration impurity region. The high concentration impurity region is formed in a region of the semiconductor film apart from the sidewall of the extended part. The low concentration impurity region is formed in a region of the semiconductor film located below the extended part.

In addition, in the semiconductor device according to the first aspect of this invention, both of the source and drain regions preferably include a high concentration impurity region and a low concentration impurity region, respectively.

By having such a structure, the position of the low concentration impurity region can be determined by using the extended part as a mask as shown in the manufacturing method described below. Then, the size (width) of this extended part is determined by partially removing the sidewall of the gate electrode by using wet etching as shown in the manufacturing method described below. Then, since the positional precision of this wet etching is sufficiently higher than the positional precision in the photolithography, which has conventionally been used for forming a low concentration impurity region, the positional precision of the low concentration impurity region can be increased. Therefore, the positional precision of the low concentration impurity region of the formed field effect transistor can be increased. As the result of this, the reliability of the field effect transistor can be increased.

In addition, in the case that an interlayer insulating film or the like is formed so as to extend from the gate electrode to the semiconductor film including the source and drain regions, a void or the like is easily created in the connection parts (corner parts) between the sidewalls of the gate electrode and the gate insulating film and the upper surface of the semiconductor film. In particular, in the case that the sidewalls of the gate electrode and the gate insulating film are located in approximately the same plane and the gate electrode and the gate insulating film form one step part, the above tendency is significant. In the present invention, however, since the extended part of the gate insulating film has already been formed in such corner parts wherein a void is the most easily created according to a prior art, the possibility where a void is created as described above can be reduced.

In addition, since a void can be prevented from being created in the corner parts formed of the sidewalls of the gate electrode and the gate insulating film and the upper surface of the semiconductor film as described above, the problem that the interlayer insulating film or the like peals due to such a void can be prevented from occurring. As a result of this, damage or an operational defect of the semiconductor device caused by such pealing of interlayer insulating film can be prevented from occurring and, therefore, the reliability of the semiconductor device can be increased.

In a semiconductor device according to the above one aspect, it is preferable for the sidewall of the extended part to be formed so as to incline with respect to the main surface of the substrate.

In this case, as shown in the manufacturing method described below, a concentration distribution so as to correspond to the inclination of the sidewall of the extended part with respect to the impurity concentration in low concentration impurity region can be formed. As a result of this, an electric field concentration can be more efficiently prevented from occurring in the low concentration impurity region.

In addition, since the sidewall of the extended part is formed so as to be inclined, at the time when an interlayer insulating film or the like is formed so as to extend from the sidewall of the gate electrode to the upper surface of the semiconductor film, the coverage of this interlayer insulating film or the like can be more improved.

In the semiconductor film according to the above one aspect, it is preferable for the gate insulating film to include an insulating film part which extends from the sidewall of the extended part to the high concentration impurity region and it is preferable for the film thickness of the insulating film part is thinner than the film thickness of the extended part or the gate insulating film.

In this case, because of the existence of the insulating film part, this insulating film part works as a protective film and, therefore, the source and drain regions can be effectively prevented from being contaminated with impurity metal or the like. As the result of this, the change of the electric characteristics of the semiconductor device due to the contamination with the impurity metal or the like in the source and drain regions can be prevented without fail and, therefore, the reliability of the semiconductor device can be more improved.

A liquid crystal display device according to the another aspect of this invention is provided with a semiconductor device according to the above first aspect.

In this case, a semiconductor device which has a high reliability can be formed as a semiconductor device in the drive circuit region or in the display pixel region of a liquid crystal display device and, therefore, the uniformity of the screen display characteristics of the liquid crystal display device can be improved. As a result of this the display characteristics of the liquid crystal display device can be improved.

In a manufacturing method for a semiconductor device according to the still another aspect of this invention, a semiconductor film is formed on the substrate. An insulating film is formed on the semiconductor film. A conductive film is formed on the insulating film. A resist film which has a sidewall is formed on the conductive film. By partially removing the conductive film through etching using the resist film as a mask, a gate electrode which has a sidewall located inside of the sidewall of the resist film is formed. By partially removing the insulating film through etching using the resist film as a mask, a gate insulating film including an extended part which has a sidewall located outside the sidewall of the gate electrode is formed. By implanting impurities into the semiconductor film by using the resist film as a mask, a high concentration impurity region for one of the source and drain regions are formed in a region of the semiconductor film apart from the sidewall of the extended part. At this time, high concentration impurity regions may be formed respectively in the source and drain regions. Then the resist film is removed. After the step of removing the resist film, by implanting impurities to the semiconductor film using the gate electrode as a mask, a low concentration impurity region for one of the source and drain regions of which the impurity concentration is comparatively lower than that of the high concentration impurity region is formed in regions of the semiconductor film located below the extended part. At this time, low concentration impurity regions may be formed respectively in the source and drain regions.

Here, the distance (receding amount of the sidewalls of the gate electrodes) from the positions of the sidewalls of the resist film to the positions of the sidewalls of the gate electrode in the step of forming the gate electrode corresponds to the size (width) of the extended parts of the gate insulating film which extend from the sidewalls of the gate electrode to the outside. Then, this receding amount of the sidewalls of the gate electrode can be controlled with high precision through isotropic etching. Therefore, the size (width) of the extended parts of the gate insulating film can be determined with high precision. Then, since the low concentration impurity regions are formed by using gate electrode as a mask, the distance (width of the extended parts) between the sidewalls of these extended parts and the sidewalls of the gate electrode becomes approximately equal to the width of the regions where the low concentration impurity regions are formed. As a result, the dimensional precision of the low concentration impurity regions can be improved in comparison with the conventional case where the resist film is used as a mask. Therefore, the electric characteristics of the formed field effect transistor can be prevented, without fail, from fluctuating due to the fluctuation of the dimension of the low concentration impurity region. As a result of this, the reliability of the semiconductor device can be improved.

In addition, the resist film which has been used at the time of forming the gate electrode can again be used as a mask at the time of forming the high concentration impurity region and, therefore, the step can be simplified in comparison with a conventional case where a resist film is newly formed so as to be used as a mask for forming these high concentration impurity region.

In a manufacturing method for a semiconductor device according to the further aspect of this invention, a semiconductor film is formed on the substrate. An insulating film is formed on the semiconductor film. A conductive film is formed on the insulating film. A resist film which has a sidewall is formed on the conductive film. By partially removing the conductive film through etching using the resist film as a mask, gate electrode which have sidewall located inside the sidewall of the resist film are formed. By partially removing the insulating film through etching using the resist film as a mask, a gate insulating film including extended part which have sidewall located outside the sidewall of the gate electrode is formed. The resist film is removed. By implanting impurities into the semiconductor film using the gate insulating film as a mask, a high concentration impurity region for one of the source and drain regions is formed in the region of the semiconductor film apart from the sidewall of the extended part. At this time, the high concentration impurity regions may be formed respectively in the source and drain regions. Then, by implanting impurities into the semiconductor film by using the gate electrode as a mask, a low concentration impurity region for one of the source and drain regions of which the impurity concentration is comparatively lower than the high concentration impurity region are formed in the region of the semiconductor film located below the extended part. At this time, the low concentration impurity regions may be formed respectively in the source and drain regions.

In this manner, in the same way as the manufacturing method for a semiconductor device in the above still another aspect, the dimension of the extended part of the gate insulating film which extend from the sidewall of the gate electrode to the outside can be determined with an excellent precision. Then, since the width of the low concentration impurity region corresponds to the width of the extended part of the gate insulating film which extend from the sidewall of the gate electrode to the outside, it becomes possible to determined the width of the low concentration impurity region with an excellent precision. Therefore, a problem can be prevented from occurring that the electric characteristics of the semiconductor device such as field effect transistor, which include these low concentration impurity region, fluctuate due to the change of the width of the low concentration impurity region. As a result of this, the reliability of the semiconductor device can be improved.

In addition, since a gate insulating film is used as a mask at the time of forming the high concentration impurity region, it is not necessary to form a resist film so as to be used as a mask at the time of forming the high concentration impurity region such as in a prior art. As a result of this, the manufacturing method for the semiconductor device can be simplified.

In addition, since a resist film is not used as a mask at the time of forming the high concentration impurity region and low concentration impurity region, the resist film which is used as a mask will not change in quality by receiving the implantation of impurities. Therefore, a problem can be prevented from occurring that the resist film of which the quality has changed remain so that a predetermined structure can not be gained and the yield of products is lowered.

In the above described manufacturing method for a semiconductor device according to the further aspect, it is preferable to carry out the step of forming high concentration impurity regions and the step of forming low concentration impurity regions simultaneously.

In this case, the manufacturing method for a semiconductor device can be more simplified.

In the above described manufacturing method for a semiconductor device according to the still another and the further aspects, it is preferable to make remain an insulating film part, which has the film thickness thinner than the film thickness of the extended part of the gate insulating film, on the semiconductor film which is to become the high concentration impurity region in the step of forming a gate insulating film.

In this case, the insulating film part can be utilized as a protective film which prevents impurities such as impurity metals from entering into the high concentration impurity region. Therefore, a problem can be prevented, without fail, from occurring that the electric characteristics of the semiconductor device fluctuate due to the existence of such an impurity metal in the high concentration impurity region. As a result of this, the reliability of the semiconductor film can be more improved.

In the manufacturing method for a semiconductor device according to the above still another and further aspects, it is preferable for the impurities implanted to the low concentration impurity regions and high concentration impurity regions to be n type conductive impurities and it is preferable for the gate electrodes, the gate insulating film and the source and drain regions to form n type thin film field effect transistors. Prior to the step of forming the gate electrodes of the n type thin film field effect transistors, it is preferable to further include the step of forming the implemented p type thin film field effect transistor. In the step of forming the p type thin film field effect transistor, preferably a resist film is formed of the conductive film. By partially removing the conductive film using the resist film as a mask, the gate electrode of the p type thin film field effect transistor is formed and at the same time a conductive film is made to remain on the region where the n type thin film field effect transistor is to be formed. By using, as a mask, the gate electrode of the p type thin film field effect transistor and the conductive film which has been made to remain on the region where the n type thin film field effect transistor is to be formed, p type conductive impurities are implanted into the semiconductor film and, thereby, one of the source and drain regions of the p type thin film field effect transistor is formed. At this time, both of the source and drain regions may be formed.

Here, when the case where n type thin film field effect transistor is formed in advance and after that p type thin film field effect transistor is formed is taken into consideration, it is necessary to form a resist film so as to cover the n type thin film field effect transistor which has already been formed at the time when the step of forming one of the source and drain regions of the p type thin film field effect transistor is carried out. This is to prevent the electric characteristics of the n type thin film field effect transistor from changing due to the implanted p type conductive impurities. In the case that p type thin film field effect transistor are formed in advance as in the above, however, a conductive film remains on the regions where n type thin film field effect transistor is to be formed at the time when p type conductive impurities are implanted and this remaining conductive film is used as a mask and, therefore, the step of forming a resist film as a mask can be omitted. As a result of this, the manufacturing method can be designed to be simplified.

In the manufacturing method for a semiconductor device according to the above described still another and further aspects, it is preferable for the sidewall of the extended part to be formed so as to incline with respect to the main surface of the substrate in the step of forming a gate insulating film.

In this case, in the step of forming low concentration impurity region, the impurity concentration in the low concentration impurity region can be changed corresponding to the inclination of the sidewall of the extended part of the gate insulating film. That is to say, the impurity concentration can be made high comparatively in the region of the semiconductor film located below the part of which the film thickness of the extended part is comparatively thin because of the inclination of the sidewall of the extended part while the impurity concentration can be made comparatively low in the region of the semiconductor film beneath the part of which the film thickness of the extended part is comparatively thick. In this manner, the graduation of the impurity concentration can be formed in the low concentration impurity region so that the change of the electric field intensity in the low concentration impurity region can be made more gentle. As a result of this, the electric field concentration can be prevented from occurring so that a problem can be prevented from occurring where the semiconductor device malfunctions due to this electric field concentration. As a result, the reliability of the semiconductor device can be more improved.

In the manufacturing method for a semiconductor device according to the above described still another and further aspects, by partially removing an insulating film through isotropic etching in the step of forming a gate insulating film, it is preferable to incline the sidewall of the extended part with respect to the main surface of the substrate.

In this case, the sidewall of the extended part can be easily inclined with respect to the main surface of the substrate.

In the manufacturing method for a semiconductor device according to the still another and further aspects, it is preferable to incline the sidewall of the extended part with respect to the main surface of the substrate by using a resist receding method in the step of forming a gate insulating film.

In this case, the rate of the resist film being removed through etching can be changed by setting the manufacturing method conditions so as to modify the etching rate of the resist film. Therefore, the etching time of the part which is to become sidewall of the extended part of the insulating film can be modified by changing the rate of the resist film being removed. Thereby, the inclination angle of the sidewall with respect to the main surface of the substrate can be modified. As a result of this, it becomes possible to freely set the angle formed between the sidewall of the extended part and the main surface of the substrate.

In the manufacturing method for a liquid crystal display device according to the still further aspect of this invention, the manufacturing method for a semiconductor device according to the above described still another or further aspects is used.

In this manner, a semiconductor device which is used in the drive circuit or for display pixel of the liquid crystal display device can be easily formed so as to have high reliability. As a result of this, a liquid crystal display device which indicates stable display characteristics can be gained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a cross section schematic view for describing a process of a second embodiment of a liquid crystal display device according to the present invention;

FIGS. 10 to 14 are cross section schematic views for describing the first to the fifth steps of a process of a third embodiment of a liquid crystal display device according to the present invention;

DESCRIPTION OF THE PREFERRED EMBODIMENTS

Figure 1:
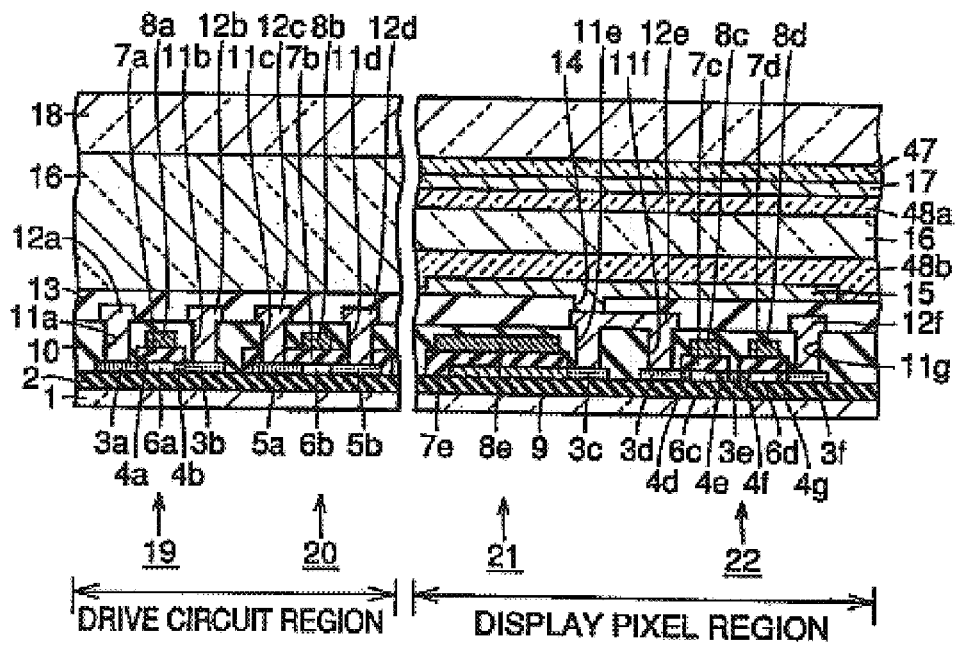
FIG. 1 is a cross section schematic view showing a first embodiment of a liquid crystal display device according to the present invention.

In the following, embodiments of the present invention are described based on the drawings. Here, in the following drawings, the same or corresponding elements are referred to by the same reference numerals, of which the descriptions are not repeated.

(First Embodiment)

Referring to FIG. 1, the first embodiment of a liquid crystal display device according to the present invention is described.

Referring to FIG. 1, a base film 2 is formed on a glass substrate 1 in the drive circuit region of a liquid crystal display device. An n type thin film field effect transistor 19 and a p type thin film field effect transistor 20 are formed on the base film 2. The n type thin film field effect transistor 19 includes $n^+$ type impurity regions 3a, 3b as high concentration impurity regions, $n^-$ type impurity regions 4a, 4b as low concentration impurity regions, a channel region 6a, a gate insulating film 7a and a gate electrode 8a. The source and drain regions which include an LDD structure are formed from these $n^+$ type impurity regions 3a, 3b and $n^-$ type impurity regions 4a, 4b. The $n^+$ type impurity regions 3a, 3b, the $n^-$ type impurity regions 4a, 4b and the channel region 6a, which are formed by using the same semiconductor film, are formed on the base film 2. The gate insulating film 7a is formed on the channel region 6a. The gate electrode 8a is formed on the gate insulating film 7a.

In addition, the p type thin film field effect transistor 20 includes p type impurity regions 5a, 5b as the source and drain regions, a channel region 6b, a gate insulating film 7b and a gate electrode 8b. The p type impurity regions 5a, 5b and the channel region 6b, which are formed by using the same semiconductor film, are formed on the base film 2. The gate insulating film 7b is formed on the channel region 6b so as to extend up to the p type impurity regions 5a and 5b. The gate electrode 8b is formed on the gate insulating film 7b.

An interlayer insulating film 10 is formed on the gate electrodes 8a and 8b. In the interlayer insulating film 10, contact holes 11a and 11b are created in the regions located above the $n^+$ type impurity regions 3a and 3b and contact holes 11c and 11d are created in the regions located above the p type impurity regions 5a and 5b, respectively. Metal wires 12a to 12b are formed so as to extend from the inside of the contact holes 11a to 11d to the upper surface of the interlayer insulating film 10. A passivation film (not shown) is formed on the metal wires 12a to 12d. A flatting film 13 is formed on the passivation film.

In the display pixel region, a capacitor 21 and a thin film field effect transistor 22 for a pixel are formed. The capacitor includes capacitor electrodes 9, 8e and an insulating film 7e which works as a dielectric film. The capacitor electrode 9 is formed on the base film 2. The insulating film 7e is formed on the capacitor electrode 9. The capacitor electrode 8e is formed on the 7e. An $n^+$ type impurity region 3c is formed in the part adjoining the capacitor electrode 9.

In addition, the thin film field effect transistor 22 for a pixel includes the first and second thin film field effect transistors. The first thin film field effect transistor has $n^+$ type impurity regions 3d, 3e as high concentration impurity regions, $n^-$ type impurity regions 4d, 4e as low concentration impurity regions, a channel region 6c, a gate insulating film 7c and a gate electrode 8c. The second thin film field effect transistor has $n^+$ type impurity regions 3e, 3f as high concentration impurity regions, $n^-$ type impurity regions 4f, 4g as low concentration impurity regions, a channel region 6d, a gate insulating film 7d and a gate electrode 8d. The base film 2 is formed on the glass substrate 1. The $n^+$ type impurity regions 3d to 3f, the $n^-$ type impurity regions 4d to 4g and the channel regions 6c, 6d, which are formed by using the same semiconductor film, are formed on the base film 2. The gate insulating films 7c, 7d are formed on the channel regions 6c, 6d. The gate electrodes 8c, 8d are formed on the gate insulating films 7c, 7d.

The interlayer insulating film 10 is formed on the above capacitor 21 and the field effect transistor 22 for a pixel. By removing part of the interlayer insulating film 10, contact holes 11e to 11g are created in the regions located above the n$^+$ type impurity regions 3c, 3d and 3f. Metal wires 12e and 12f are formed so as to extend from the inside of the contact holes 11e to 11g to the upper surface of the interlayer insulating film 10. A passivation film (not shown) is formed on the metal wires 12e and 12f. A flatting film 13 is formed on this passivation film. A contact hole 14 is created by removing part of the flatting film 13 and the passivation film in the region located above the metal wire 12e. A pixel electrode 15 made of a transparent conductive film such as ITO is formed so as to extend from the inside of the contact hole 14 to the upper surface of the flatting film 13. An orientation film 48b is formed on the pixel electrode 15.

An upper glass substrate 18 is deposited so as to oppose the glass substrate 1 wherein an n type thin film field effect transistor 19 such as the above, a p type thin film field effect transistor 20, a capacitor 21 and a thin film field effect transistor 22 for a pixel are formed. A color filter 47 is formed on the surface of the upper glass substrate 18 which opposes to the glass substrate 1. An opposite electrode 17 is formed on the surface which opposes to the glass substrate 1 of the color filter 47. An orientation film 48a is formed on the surface which opposes to the glass substrate 1 of the opposite electrode 17. Then, liquid crystal 16 is sealed in between this glass substrate 1 and the upper glass substrate 18.

Figure 2:
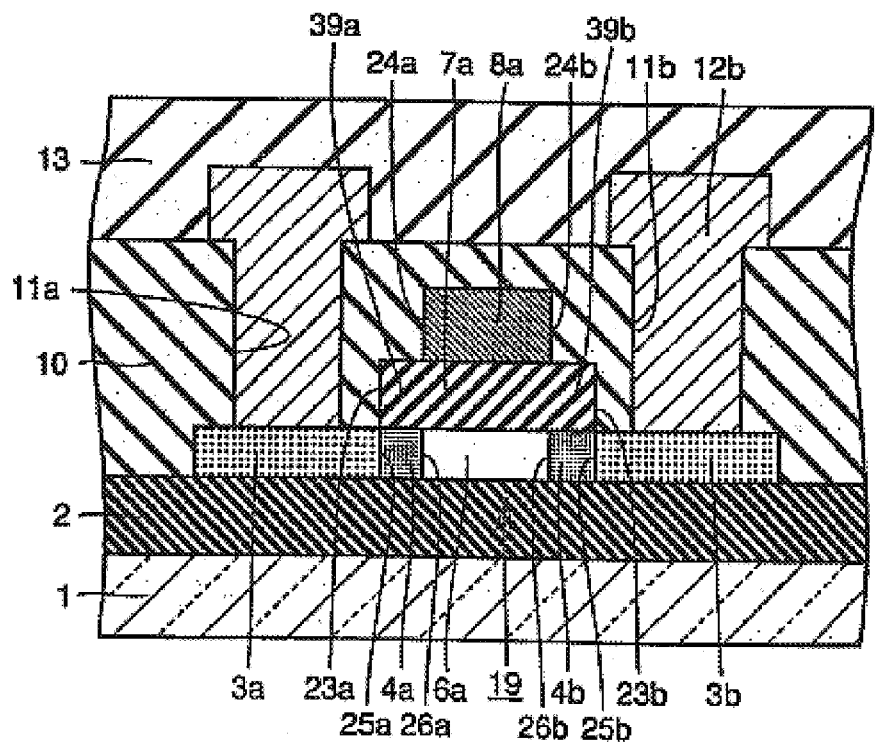
FIG. 2 is a partially enlarged cross section schematic view of the liquid crystal display device as shown in FIG. 1.

Here, the n type thin film field effect transistor 19 which is formed on the glass substrate 1 includes, as shown in FIG. 2, extended parts 39a and 39b of the gate insulating film 7a having the sidewalls 23a and 23b which are located outside of the sidewalls 24a and 24b of the gate electrode 8a. Referring to FIG. 2, the n$^+$ type impurity regions 3a and 3b are formed in regions of a semiconductor film which are located outside of the sidewalls 23a and 23b of the extended parts 39a and 39b. Then, n$^-$ type impurity regions 4a and 4b of which the impurity concentration is lower than that of the n$^+$ type impurity regions 3a and 3b are formed in regions of the semiconductor film located below the extended parts 39a and 39b. Then, as can be seen from a process for a liquid crystal display device as described below, the respective border parts 25a and 25b between the n$^+$ type impurity regions 3a, 3b and the n$^-$ type impurity regions. 4a, 4b are approximately located below the sidewalls 23a, 23b of the extended parts 39a, 39b. Then, the edge parts 26a and 26b of the n$^+$ type impurity regions are approximately located below the sidewalls 24a, 24b of the gate electrode 8a.

By having such a structure, as shown in a process as described below, the n$^+$ type impurity regions 3a and 3b can be formed by implanting impurities into the semiconductor film using, as a mask, the gate insulating film 7a which includes the above extended parts 39a and 39b or the resist film which is used to form this gate insulating film 7a. In addition, by implanting impurities into the semiconductor film using the gate electrode 8a as a mask the n$^-$ type impurity regions 4a and 4b can be formed. Then, since the relative positions of the sidewalls 24a, 24b of this gate electrode 8a and the sidewalls 23a, 23b of the extended parts 39a, 39b can be determined with a high precision through etching consequently the dimensional precision and positional precision of the n$^-$ type impurity regions 4a and 4b can be increased in comparison with a prior art. Therefore, in the n type thin film field effect transistor 19, a problem can be prevented from occurring where the electric characteristics of this transistor fluctuate due to a shift of the arrangement or the dimension of the n$^-$ type impurity regions 4a and 4b from the set value. As a result of this, the electric characteristics of the n type thin film field effect transistor 19 can be stabilized and, therefore, an n type thin film field effect transistor 19 can be gained as a semiconductor device which has a high reliability. In addition, by using an n type thin film field effect transistor 19 which has such a high reliability, a liquid crystal display device of which the display characteristics are stable can be gained.

Furthermore, since the gate insulating film 7a includes the extended parts 39a and 39b, in the case that corner parts formed along the line intersecting the gate electrode 8a and the gate insulating film 7a and the upper surface of the n$^+$ type impurity regions 3a, 3b are filled in with an interlayer insulating film 10, it becomes possible to fill in the corner parts with the interlayer insulating film 10 more easily than in the case where the sidewalls 24a, 24b of the gate electrode 8a and the sidewalls in the edge parts of the gate insulating film 7a are formed so as to be approximately on the same plane. That is to say, defects such as voids are easy to occur in the above corner parts at the time of being filled in with the interlayer insulating film 10. However, because of the condition where the extended parts 39a and 39b are formed from the beginning in the vertexes of these corner parts, the corner parts can be in a gentler form than in the case where these extended parts 39a and 39b do not exist.

In addition, defects such as gaps can be prevented from occurring in the above corner parts at the time when the interlayer insulating film 10 is formed as described above and, therefore, a problem such as peeling of the interlayer insulating film 10 due to such gaps can be prevented from occurring.

Here, referring to FIG. 1, an n type film field effect transistor is formed in a thin film field effect transistor 22 for a pixel in the display pixel region. Then, since this n type thin film field effect transistor also has the same structure as of the n type thin film field effect transistor 19 as described in FIG. 2, the same effects can be gained.

In addition, in a liquid crystal display device as shown in FIGS. 1 and 2, for example, a silicon oxide film can be used as a base film 2. The film thickness of this base film 2 is 300 nm. And the film thickness of the semiconductor film, wherein the n$^+$ type impurity regions 3a to 3f, the n$^-$ type impurity regions 4a, 4b, 4d to 4g and the channel regions 6a to 6d are formed, is 55 nm. The film thickness of the gate insulating film 7a to 7d is 80 nm. The film thickness of the gate electrodes 8a to 8d is 200 nm. The film thickness of the interlayer insulating film 10 is 600 nm. The metal wires 12a and 12b have a two layered film wherein an aluminum film is formed on a chromium film. Then, the film thickness of this chromium film is 100 nm and the film thickness of the aluminum film is 300 nm. The passivation film is made of, for example, a silicon nitride film of which the film thickness is 100 nm. Then, the film thickness of the flatting film 13 is 3 μm. The film thickness of the pixel electrode 15 is 150 nm.

Referring to FIGS. 3 to 8, a process for a liquid crystal display device as shown in FIGS. 1 and 2 is described.

First, a silicon oxide film is formed on the surface of a glass substrate 1 (see FIG. 3) as a base film 2. After that an amorphous silicon film is formed on the base film 2. By carrying out an annealing process using laser on this amorphous silicon film, this amorphous silicon film is converted to a polysilicon film. Then, a resist film which has a channel pattern is formed on this polysilicon film. The polysilicon film is partially removed through etching by using this resist film as a mask.

In this manner, the polysilicon films 27a to 27c (see FIG. 3) and a polysilicon film which is to become a capacitor electrode 9 (see FIG. 1) are formed. As for the etching conditions for a polysilicon film at the time of forming the polysilicon films 28a to 27c, conditions such as atmospheric pressure 20 Pa, power 1000 W, utilized gasses of F123 (0.2 liter/min (200 sccm)), $SF_6$ (0.18 liter/min (180 sccm)) and $O_2$ (0.03 liter/min (30 sccm)) can be used. After that, the resist pattern is removed. By implanting dopant impurities into a polysilicon film which is to become the capacitor electrode, a conductive film 28 (see FIG. 3) is formed. Then, an insulating film 37 (see FIG. 3), which is to become a gate insulating film, is formed on the polysilicon films 27a to 27c and the conductive film 28. The thickness of the insulating film 37 is approximately 70 nm to 80 nm.

Figure 3:
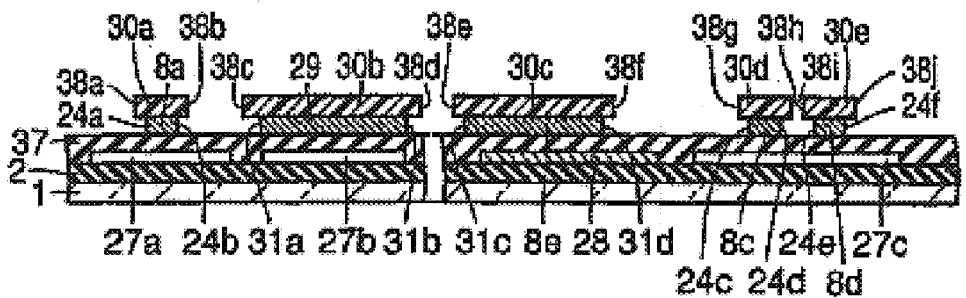
FIGS. 3 to 8 are cross section schematic views for describing the first to the sixth steps of a process for the liquid crystal display device as shown in FIGS. 1 and 2.

A conductive film, which is to become a gate electrode, is formed on this insulating film 37. Resist films 30a to 30e (see FIG. 3) which have a gate pattern are formed. These resist films 30a, 30d and 30e are used as a mask to form gate electrodes of n type thin film field effect transistors, respectively. The resist film 30c is used as a mask for forming a capacitor electrode 8e. By partially removing the conductive film through wet etching using the resist films 30a to 30e as a mask, the gate electrodes 8a, 8c and 8d (see FIG. 3), a conductive film 29 and a capacitor electrode 8e are formed. In this wet etching, the sidewalls 24a to 24f of the gate electrodes 8a, 8c and 8d are wet etched so as to recede from the sidewalls 38a, 38b, 38g to 38j of the resist films 30a, 30d and 30e by approximately 0.5 µm to 1.5 µm. At this time, in the same manner, the condition is gained that the conductive film 29 and the sidewalls 31a to 31d of the capacitor electrode 8e also recede from the positions of the sidewalls 38c to 38f of the resist films 30b and 30c by approximately 0.5 µm to 1.5 µm. In the case that a chromium film is used as the materials for the gate electrodes 8a, 8c and 8d and the conductive film 29 and the capacitor electrode 8e, a mixture solution of perchloric acid and ammonium cerium sulphate can be used as a etching liquid and the conditions such as the etching temperature of 25° C. and the etching condition of just etching ×200% can be used in the etching process of this chrome film. In this manner, a structure as shown in FIG. 3 is gained.

Figure 4:
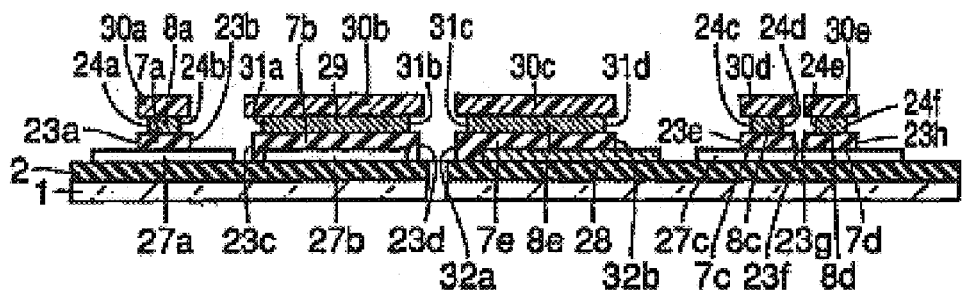

Next, the insulating film 37 is partially removed through anisotropic etching such as dry etching by using the resist films 30a to 30e as a mask. In this manner, as shown in FIG. 4, the gate insulating films 7a to 7d and an insulating film 7e as a dielectric film are formed. As a result of this, The extended parts located outside of the sidewalls 24a to 24f of the gate electrodes 8a, 8c and 8d are formed in the gate insulating films 7a, 7c and 7d. That is to say, the sidewalls 23a, 23b, 23e to 23h of the extended parts of the gate insulating film 7a, 7c and 7d are located outside of the sidewalls 24a to 24f of the gate electrodes 7a, 7c and 7d. In addition, in the same manner, the sidewalls 23c and 23d of the gate insulating film 7b are also located outside of the sidewalls 31a and 31b of the conductive film 29. In addition, the sidewalls 32a and 32b of the insulating film 7e are also located outside of the sidewalls 31c and 31d of the capacitor electrode 8e.

Here, as for the etching conditions for forming these gate insulating films 7a to 7d and the insulating film 7e, for example, the atmospheric pressure is 20 Pa, the power is 1500 W and utilized gasses can be $CHF_3$ (0.18 liter/min (180 sccm)), $O_2$ (0.02 liter/min (20 sccm)) and Ar (0.2 liter/min (200 sccm)).

Figure 5:
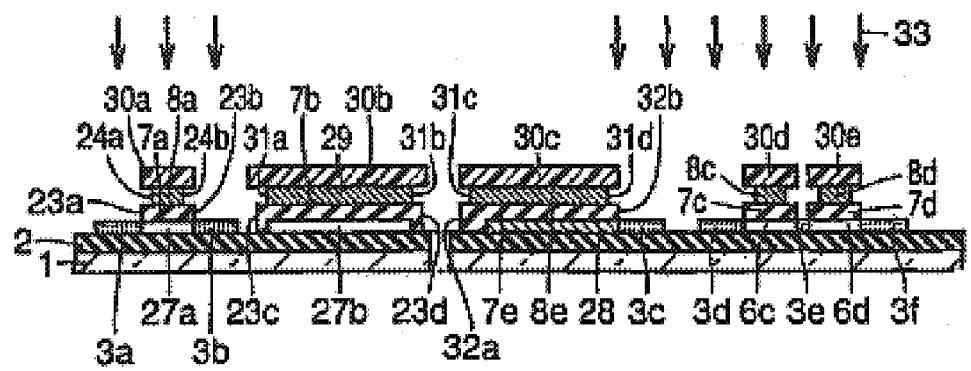

Next, as shown in FIG. 5, by injecting phosphorous ions 33 into predetermined regions of the polysilicon films 27a, 27c and the conductive film 28 by using the resist films 30a, 30c to 30e as a mask and by using an ion doping device, the $n^+$ type impurity regions 3a to 3f are formed. As for the injection conditions of the injected phosphorous ions 33, the injection energy is $1.6 \times 10^{-15}$J (10 keV) and the condition where the injection density is 1 to $5 \times 10^{15}$ $cm^{-2}$ can be used.

Here, in the step as shown in FIG. 4, since the insulating film has been removed from the regions located above the $n^+$ type impurity regions 3a to 3f, the injection energy at the time of injecting phosphorous ions 33 can be reduced in comparison with the case where the insulating film 37 has remained. In this manner, the injection energy of phosphorous ions 33 can be reduced and, therefore, the change of the resist film 30a to 30e in the quality due to this injection of phosphorous ions 33 can be prevented. As a result of this, a problem can be prevented from occurring where the resist films 30a to 30e of which the quality has changed remains without being removed.

In addition, as shown in FIG. 5, since the resist films 30a to 30e which has been used for forming the gate electrodes 8a, 8c, 8d and the conductive film 29 and the capacitor electrode 8e is used as it is as a mask at the time of forming the $n^+$ type impurity regions 3a to 3f, the step of forming a new resist film is not necessary to carry out as in a prior art. Therefore, the process for a liquid crystal display device can be simplified in comparison with a prior art.

Figure 6:
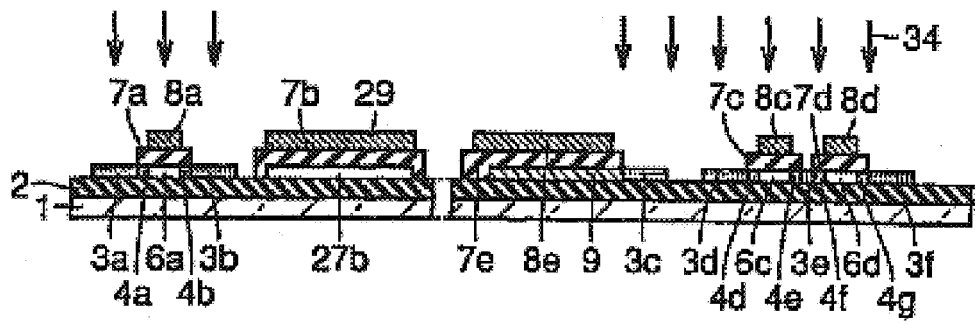

Next, the resist films 30a to 30e is removed. Then, as shown in FIG. 6, by injecting phosphorous ions 34 by using the gate electrodes 8a, 8c and 8d as a mask, $n^-$ type impurity regions 4a, 4b, 4d to 4g are formed. As for the conditions of this injection of phosphorous ions 34, for example, the injection energy can be $8.0 \times 10^{-15}$J (50 keV) and the injection density can be approximately $1 \times 10^{14}$ $cm^{-2}$.

In the step as shown in FIG. 3, since the controllability of the wet etching used at the time of forming the gate electrodes 8a, 8c and 8d is very high, the distance between the sidewalls 24a to 24f of the gate electrodes 8a, 8c and 8d and the sidewalls 38a, 38b, 38g to 38i of the resist films 30a, 30d and 30e can be set with a high precision and uniformly at a predetermined value respectively for the gate electrodes 8a, 8c and 8d. Then, as shown in FIG. 4, since the gate insulating films 7a, 7c and 7d are formed as a mask of this resist film 30a, 30d and 30e, the positions of the sidewalls 38a, 38b, 38g to 28j of the resist film. 30a, 30d and 30e and the sidewalls 23a, 23b, 23e to 23h of the gate insulating film 7a, 7c and 7d approximately agree. (And the positions of the sidewalls 38c to 38f of the resist films 30b, 30c and the sidewalls 23c, 23d, 32a, 32b of the gate insulating film 7b and insulating film 7e also approximately agree.) That is to say, the distance between the sidewalls 24a to 24f of the gate electrodes 8a, 8c, 8d and the sidewalls 23a, 23b, 23e to 23h of the gate insulating films 7a, 7c, 7d is possible to be set precisely and uniformly. As a result of this, the size and the positions of the $n^-$ type impurity regions 4a, 4b, 4d to 4g are determined by the sidewalls 24a to 24f of the gate electrodes 8a, 8c, 8d and the sidewalls 23a, 23b, 23e to 23h of the gate insulating films 7a, 7c, 7d and, therefore, the dimensional precision of the $n^-$ type impurity regions 4a, 4b, 4d to 4g can be increased in comparison with a prior art. Thereby, a problem can be prevented from occurring where the electric characteristics of the n type thin film field effect transistor 19 and the thin film field effect transistor 22 for a pixel fluctuate due to the fluctuation of the dimension and positions of these $n^-$ type impurity regions 4a, 4b, 4d to 4g. As a result of this, a drive circuit with high reliability and a control circuit in the pixel region can be formed and, therefore, the display characteristics of the liquid crystal display device can be uniformed and stabilized.

Figure 7:
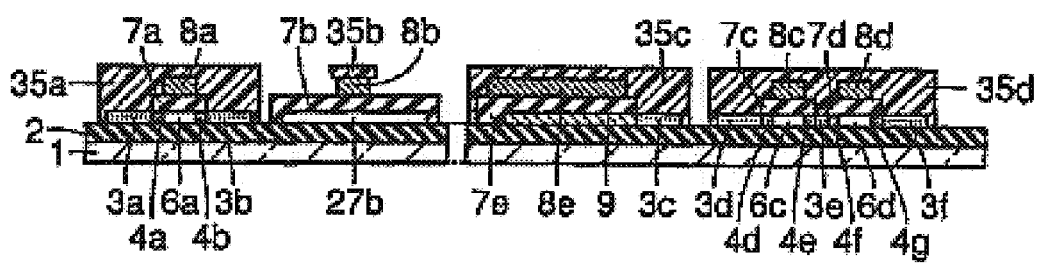

Then, after the step as shown in FIG. 6, resist films 35a to 35d (see FIG. 7) which have a pattern for forming a gate electrode 8b of the p type thin film field effect transistor 20 is formed. Then, by partially removing the conductive film 29 through wet etching using the resist films 35a to 35d as a mask, the gate electrode 8b is formed as shown in FIG. 7. After that, the resist films 35a to 35d are removed.

Figure 8:
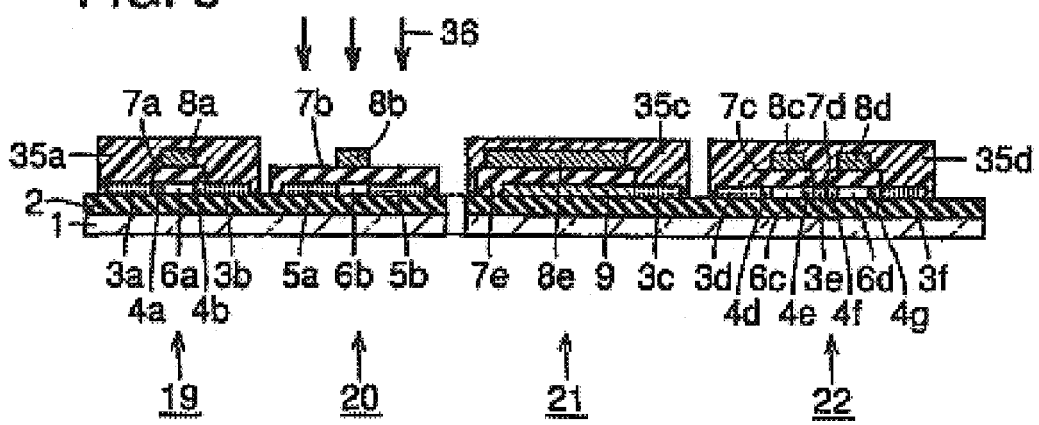
Figure 12:
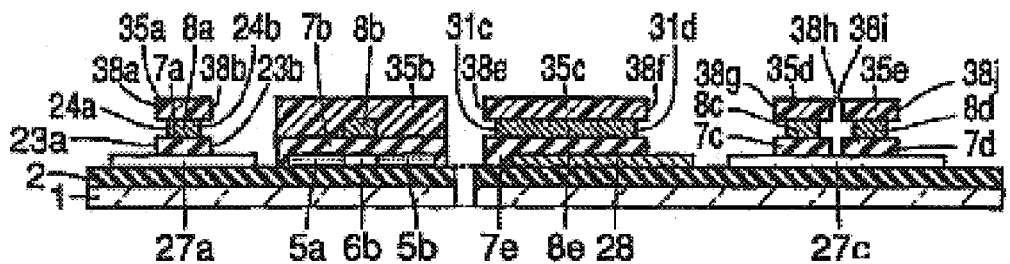

After that, as shown in FIG. 8, after forming the resist films 35a, 35c, 35d in regions other than the regions where in a p type thin film field effect transistor 20 is formed, p type impurity regions 5a, 5b are formed by injecting boron ions 36 into a predetermined region of the polysilicon film 27b. As for the condition of this injection of boron ions 36, the injection energy is $6.4 \times 10^{-15}$ J (40 keV) and the injection density is 1 to $5 \times 10^{15}$ cm$^{-2}$. After that, the resist films 35a, 35c, 35d are removed.

After that, by using the same steps as in the prior art, an insulating film 10, metal wires 12a to 12f, a passivation film, a flattening film 13, a pixel electrode 15, an orientation film 48b or the like are formed. In this manner, the structure on the glass substrate 1 is completed. Then, an upper glass substrate 18 including a color filter 47, an opposite electrode 17, and an orientation film 48a is prepared as shown in FIG. 1 so that this glass substrate 1 and the upper glass substrate 18 are arranged and fixed so as to oppose to each other. Then, liquid crystal 16 is injected and sealed in between this glass substrate 1 and the upper glass substrate 18 and, thereby, a liquid crystal display device as shown in FIG. 1 can be gained easily.

Here, the metal wires 12a to 12f have a two layered film where an aluminum film is formed on a chromium film as described above, and the etching conditions at the time of forming these metal wires 12a to 12f can be used as follows. First, as for the etching conditions at the time of etching the aluminum film, for example, a mixture of phosphoric acid, nitric acid and acetic acid is used as an etching liquid, the etching temperature is 40° C. and the condition of just etching X150% is used as the etching condition. In addition, the etching conditions of the chromium film are basically the same as the etching conditions at the time of forming gate electrodes 7a to 7d. In addition, as for the conditions of carrying out etching for forming a contact hole 14 in the passivation film, the conditions can be used wherein, for example, the atmospheric pressure is 5 Pa, the power is 100 W, the utilized gases are $CF_4$ (0.05 liter/min (50 sccm)) and $O_2$ (0.06 liter/min (60 sccm)).

In addition, in the case that an ITO film is used as a pixel electrode 15, as for the etching conditions for forming this pixel electrode 15, the conditions can be used where, for example, a mixture solution of hydrochloric acid and nitric acid is used as etching liquid, the etching temperature is 40° C. and the etching condition is just etching×150%.

(Second Embodiment)

Referring to FIG. 9, a process for a liquid crystal display device of the second embodiment according to the present invention is described.

First, after carrying out the steps as shown in FIGS. 3 and 4 in a process for a liquid crystal display device of the first embodiment according to the present invention, the resist films 30a to 30e (see FIG. 4) are removed. Then, as shown in FIG. 9, phosphorous ions 33 are injected in predetermined regions by using the gate insulating films 7a, 7c, 7d and an insulating film 7e as a mask and by using an ion doping device. In this manner the n$^+$ type impurity regions 3a to 3f are formed. As for the injection conditions of phosphorous ions 33 at this time, the conditions are used where, for example, the injection energy is $1.6 \times 10^{-15}$ J (10 keV) and the injection density is 1 to $5 \times 10^{15}$ cm$^{-2}$.

After this, by carrying out the same step as the steps as shown in FIGS. 6 to 8, a liquid crystal display device which has substantially the same structure as of the liquid crystal display device as shown in FIG. 1 can be gained.

According to such a process, in addition to gaining the same effects has the effects gained by the process for a liquid crystal display device according to the first embodiment of the present invention, since no resist film is formed at the time of injecting phosphorous ions 33, a problem can be prevented without fail from occurring where the resist film is changed in the quality due to the injection of phosphorous ions 33 and the resist film of which the quality has changed remains even after the resist film removal step.

(Third Embodiment)

Referring to FIGS. 10 to 14, a process for a liquid crystal display device of the third embodiment according to the present invention is described.

First, the steps up to the formation of a conductive film, which is to become gate electrodes 8a to 8d, in the step as shown in FIG. 3 are carried out. Then, in order to form a p type thin film field effect transistor 20 (see FIG. 1) in advance, resist films 30a to 30d (see FIG. 10) are formed on the above conductive film. By partially removing the conductive film through wet etching using this resist film as a mask, a gate electrode 8b and a conductive films 29a to 29c are formed as shown in FIG. 10.

Next, the resist films 30a to 30d are removed. Then, as shown in FIG. 11, by injecting boron ions 36 into predetermined regions in the polysilicon film 27b, p type impurity regions 5a, 5b are formed. As for the injection conditions of boron ions 36, the conditions can be used wherein, for example, the injection energy is $8.0 \times 10^{-15}$ J (50 keV) and the injection density is 1 to $5 \times 10^{15}$ cm$^{-2}$.

Next, resist films 35a to 35e (see FIG. 12) is formed on the conductive films 29a to 29c and the gate electrode 8b. Then, by using the same steps as the steps as shown in FIGS. 3 and 4, the gate electrodes 8a, 8c, 8d, the capacitor electrode 8e and the gate insulating films 7a to 7d and the insulating film 7e are formed.

Figure 13:
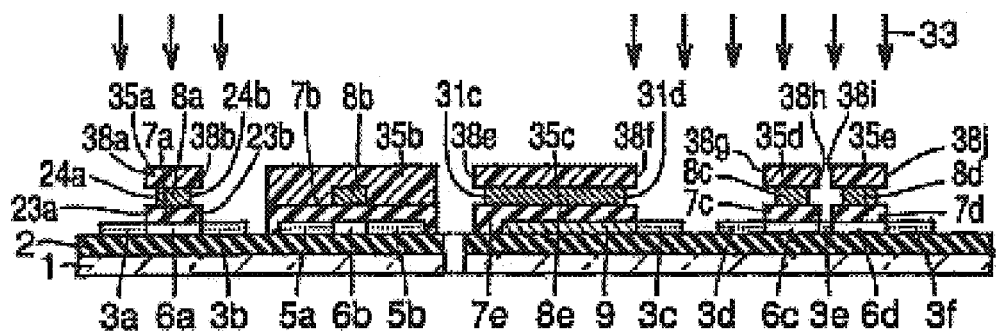

Next, as shown in FIG. 13, by injecting phosphorous ions 33 into predetermined regions, n$^+$ type impurity regions 3a to 3f are formed. As for the injection conditions of phosphorous ions at this time, the conditions can be used where the injection energy is $1.6 \times 10^{-15}$ J (10 keV) and the injection density is 1 to $5 \times 10^{15}$ cm$^{-2}$. After that, the resist films 35a to 35e are removed.

Figure 14:
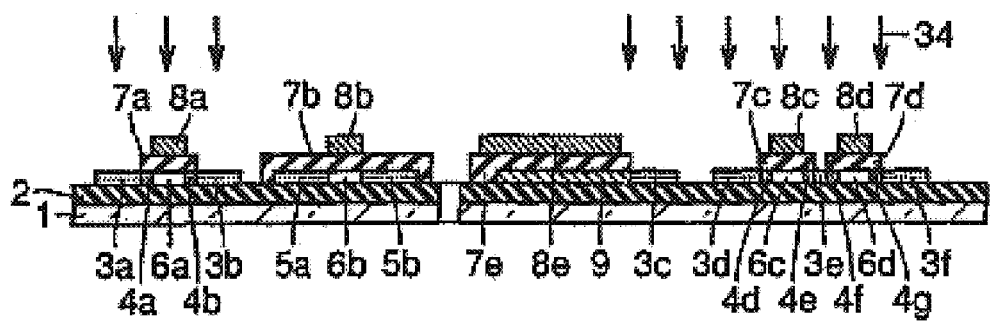

Next, as shown in FIG. 14, by injecting phosphorous ions 34 into predetermined regions in the same way as in the step shown in FIG. 6, the n$^-$ type impurity regions 4a, 4b, 4d to 4g are formed. As for the injection conditions of phosphorous ions 34, the conditions can be used where the injection energy is $6.4 \times 10^{-15}$ J (40 keV) and the injection density is $1 \times 10^{14}$ cm$^{-2}$ or less.

After this, by carrying out the steps as shown in FIGS. 7 and 8, a liquid crystal display device which is the same as the liquid crystal display device according to the first embodiment of the present invention as shown in FIGS. 1 and 2 can be gained.

In addition, in accordance with a process for a liquid crystal display device as shown in FIGS. 10 to 14, the same effects as the effects gained in the process for a liquid crystal display device according to the first embodiment of the present invention as shown in FIGS. 3 to 8 can be gained.

In accordance with the above described process, the same effects as the effects gained in the process for a liquid crystal display device according to the first embodiment of the present invention as shown in FIGS. 3 to 8 can be gained and at the same time the number of times where a resist film is formed between the steps as shown in FIGS. 10 and 14 is twice. This is a smaller number of times than three times, which is the number of times where a resist film is formed during the steps as shown in FIGS. 3 to 8. That is to say, the step of forming a resist film can be eliminated once so that the process for a liquid crystal display device can be simplified. This is because the conductive films 29a to 29c work as a mask for protecting regions other than the region wherein the p type thin film field effect transistor 20 is to be formed at the time when boron ions 36 are injected in the step as shown in FIG. 11 and because no resist film for protecting the part of the p type thin film field effect transistor 20 needs to be formed since the injection energy and the injection density of phosphorous ions 34 are sufficiently small in the step of forming n⁻ type impurity regions 4a, 4b, 4d to 4g as shown in FIG. 14.

Here, in the step as shown in FIG. 13, the step as shown in FIG. 9 may be applied in the same way as in the process for a semiconductor device according to the second embodiment of the present invention. In this case, the same effects as in the second embodiment of the present invention can be gained.

(Fourth Embodiment)

Figure 15:
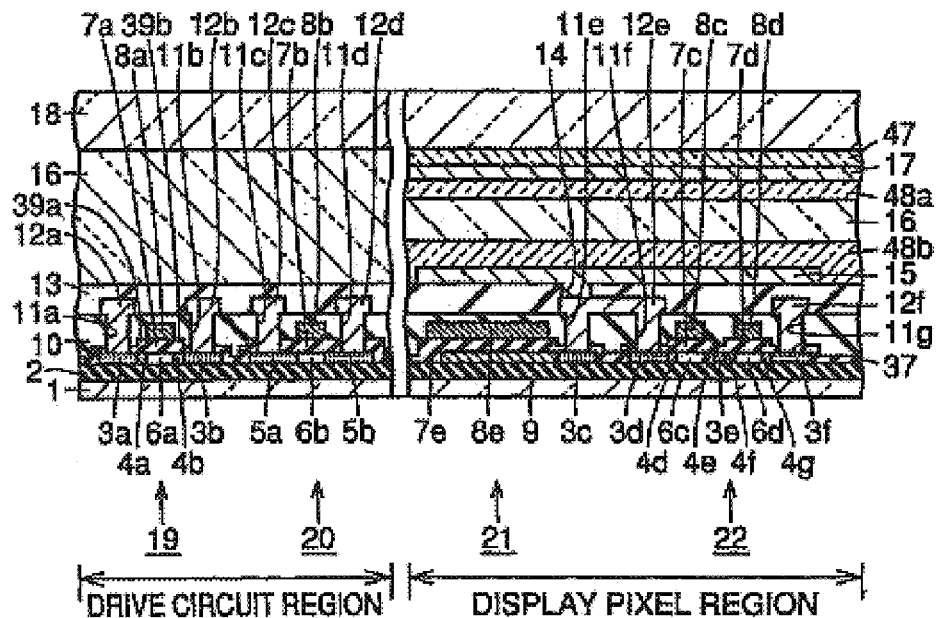
FIG. 15 is a cross section schematic view showing a fourth embodiment of a liquid crystal display device according to the present invention.
Figure 16:
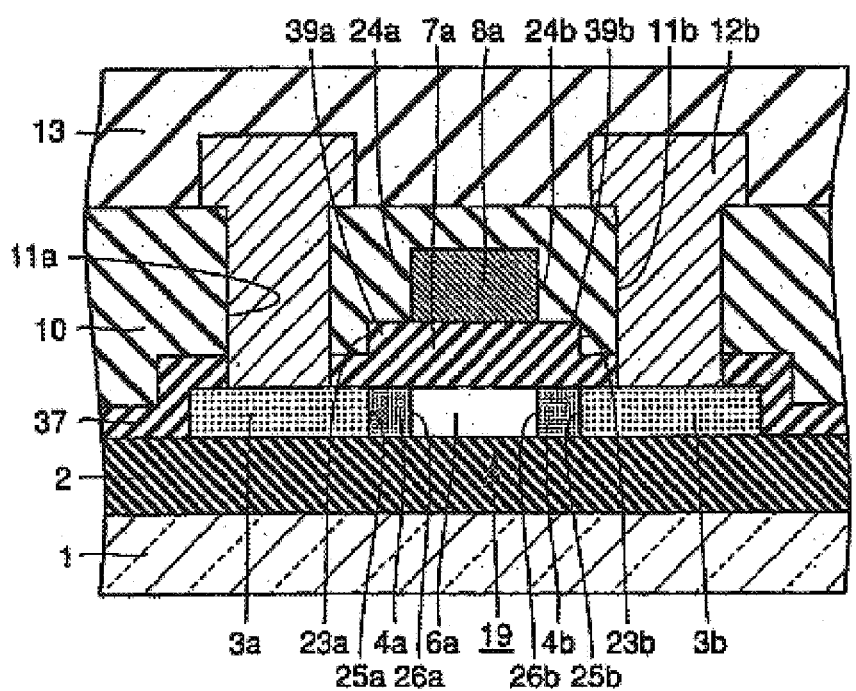
FIG. 16 is a partially enlarged cross section schematic view of the liquid crystal display device as shown in FIG. 15.

Referring to FIGS. 15 and 16, the fourth embodiment of a liquid crystal display device according to the present invention is described.

Referring to FIGS. 15 and 16, the liquid crystal display device has, basically, the same structure as the liquid crystal display device as shown in FIGS. 1 and 2.

Here, in the liquid crystal display device as shown in FIGS. 15 and 16 includes insulating film parts of the gate insulating films 7a, 7c and 7d which extend to the n⁺ type impurity regions 3a, 3b, 3d to 3f in an n type thin film field effect transistor 19 an n type thin film field effect transistor 22 for a pixel.

Therefore, the liquid crystal display device as shown in FIGS. 15 and 16 has the effects, in addition to the effects gained by the liquid crystal display device according to the first embodiment of the present invention as shown in FIGS. 1 and 2, where the above extended parts of the gate insulating films 7a, 7c and 7d work as a protective film for the n⁺ type impurity regions 3a to 3f as shown in a process described below. That is to say, because of the existence of the above insulating film parts, impurity metals, or the like, can be prevented from entering into the above n⁺ type impurity regions 3a to 3f during the process. Therefore, a problem can be from occurring in that the electric characteristics of the n type thin film field effect transistor 19, or the like, fluctuate due to such impurity metals. As a result of this, the reliability of the n type thin film field effect transistor 19 increases and, therefore, the reliability of the liquid crystal display device increases as a consequence and the display characteristics of the liquid crystal display device can be stabilized and made uniform.

FIGS. 17 to 21 are cross section schematic views for describing a process for the liquid crystal display device as shown in FIGS. 15 and 16. Referring to FIGS. 17 to 21 the process for a liquid crystal display device is described.

First, the same step is carried out as the step shown in FIG. 3. After that, the insulating film 37 is partially removed through anisotropic etching by using the resist films 30a to 30e (see FIG. 17) as a mask. The condition at this time is such that the insulating film 37 remains so as to cover the polysilicon film 27a to 27c. Then, film thickness of the insulating film 37, which extends outside of the extended parts 39a, 39b, 39g to 39j of the gate insulating films 7a, 7c and 7d, are made to be approximately 40 nm to 60 nm.

Figure 18:
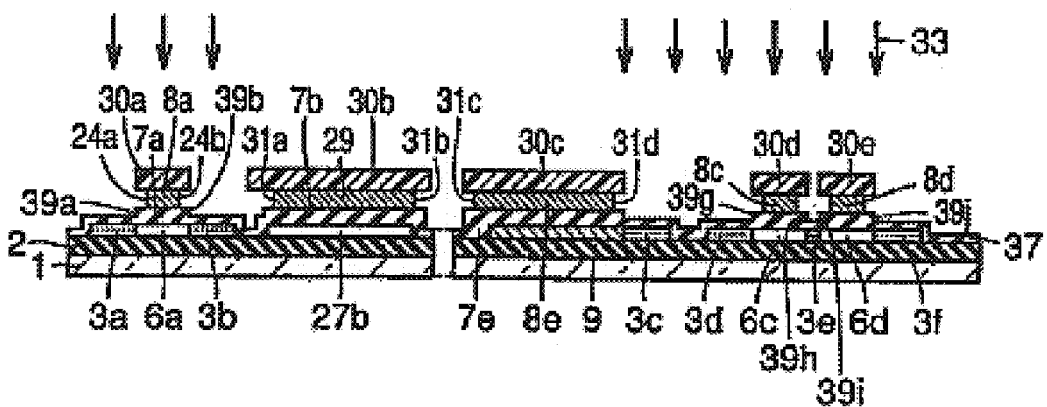

After that, n⁺ type impurity regions 3a to 3f are formed by injecting phosphorous ions 33 into predetermined regions using an ion doping device. As for the injection conditions of these phosphorous ions 33, the injection energy is 4.8 to $6.4 \times 10^{-15}$J(30 to 40 keV) and the injection density is 1 to $5 \times 10^{15}$ cm⁻². In this manner the structure as shown in FIG. 18 is gained. Here, in this manner, since the insulating film 37 remains as insulating film parts in regions positioned above the n⁺ impurity regions 3a to 3f, impurities such as impurity metals, can be prevented without fail from entering into these n⁺ type impurity regions 3a to 3f. As a result of this, a problem can be prevented from occurring in that the electric characteristics of the formed n type thin film field effect transistor 19, or the like, fluctuate because of the existence of the entered impurities, or the like.

Figure 19:
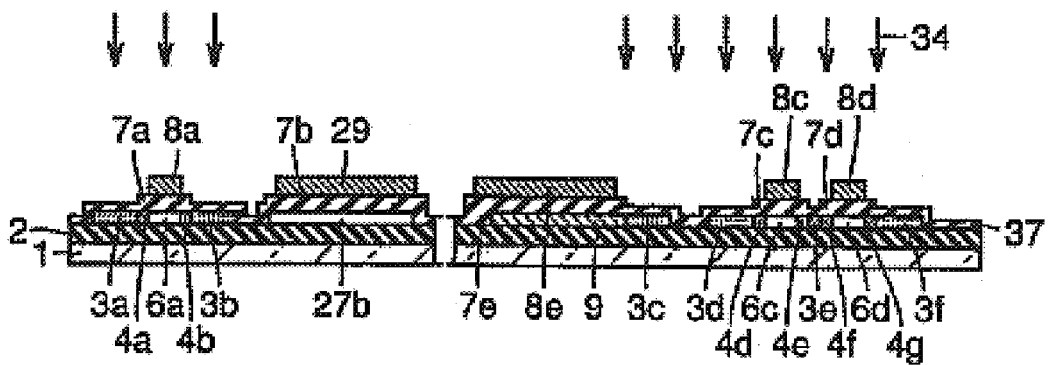

Next, the resist films 30a to 30e are removed. Then, as shown in FIG. 19, phosphorous ions 34 are injected into predetermined regions using an ion doping device by utilizing the gate electrodes 8a, 8c and 8d as a mask. As for the injection conditions of these phosphorous ions 34, the conditions can be used wherein the injection energy is $8.0 \times 10^{-15}$J(50 keV) and the injection density is $1 \times 10^{14}$ cm⁻² or less. In this manner, n type impurity regions 4a, 4b, 4d to 4g are formed.

Figure 20:
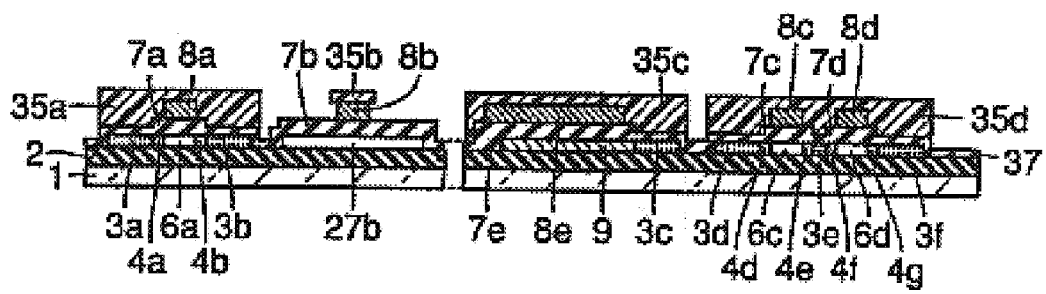

Next, a resist film 35a to 35d (see FIG. 20) is formed. Then, by using this resist film 35a to 35d as a mask a gate electrode 8b (see FIG. 20) is formed by partially removing the conductive film 29 through wet etching. In this manner, the structure as shown in FIG. 20 is gained. After that, the resist films 35a to 35d are removed.

Figure 21:
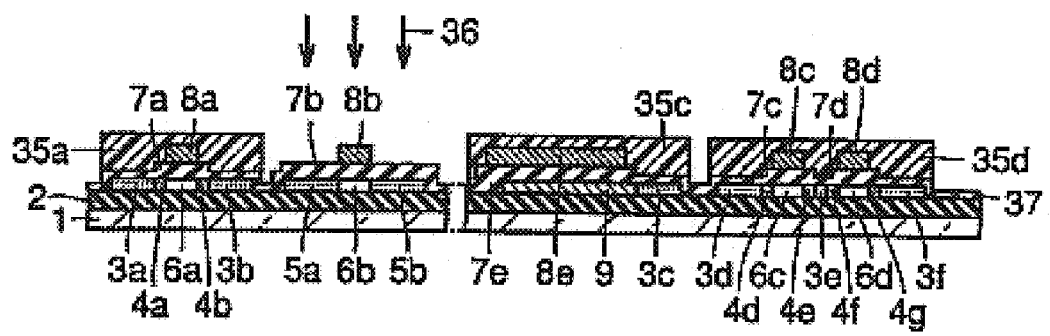

Next, as shown in FIG. 21, resist films 35a, 35c, 35d are formed in the regions other than the region where the p type thin film field effect transistor 20 is to be formed. Then, p type impurity regions 5a and 5b are formed by injecting boron ions 36 into predetermined regions using the gate electrode 8b as a mask. As for the injection conditions of these boron ions 36, the conditions can be used wherein the injection energy is $6.4 \times 10^{-15}$J(40 keV) and the injection density is 1 to $5 \times 10^{15}$ cm⁻².

After this, by carrying out the same step as the step carried out after the step as shown in FIG. 8 in the first embodiment according to this invention, a liquid crystal display device as shown in FIGS. 15 and 16 can be easily gained. The same effects as in the process for a liquid crystal display device according to the first embodiment of the present invention can also be gained in the process for a liquid crystal display device as shown in FIGS. 17 to 21.

(Fifth Embodiment)

Figure 22:
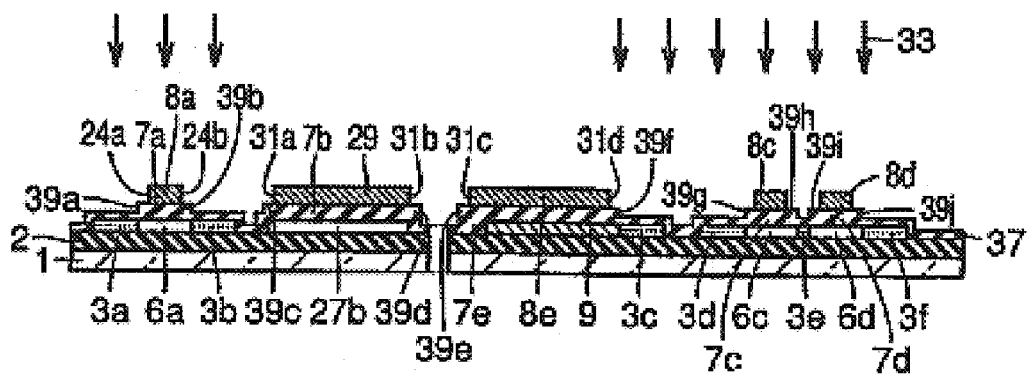
FIG. 22 is a cross section schematic view for describing a process of a fifth embodiment of a liquid crystal display device according to the present invention.

Referring to FIG. 22, a process for a liquid crystal display device according to the fifth embodiment of the present invention is described.

Figure 17:
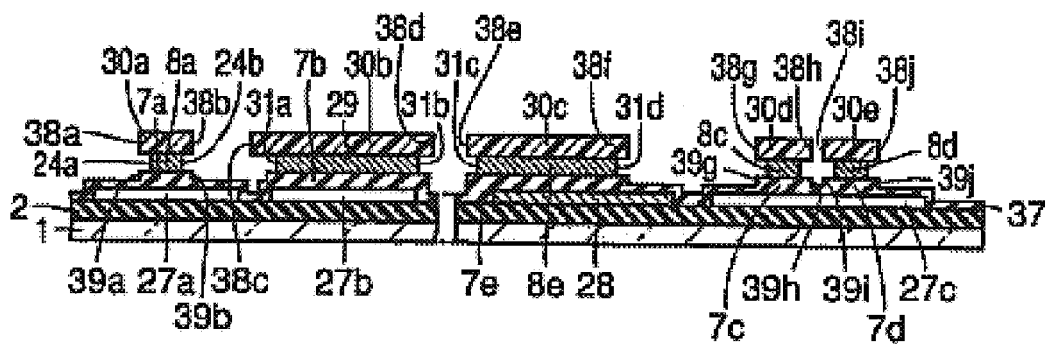
FIGS. 17 to 21 are cross section schematic views for describing the first to the fourth steps of a process for the liquid crystal display device as shown in FIGS. 15 and 16.

First, after carrying out the step as shown in FIG. 17, the resist films 30a to 30e (see FIG. 17) are removed. Then, as shown in FIG. 22, n⁺ type impurity regions 3a to 3f are formed by injecting phosphorous ions 33 into predetermined regions by using the gate insulating films 7a, 7c and 7d as a mask. As for the injection conditions of these phosphorous ions 33, the conditions can be used wherein the injection energy is 4.8 to 6.4×10$^{-15}$ J(30 to 40 keV) and the injection density is 1 to 5×10$^{15}$ cm$^{-2}$.

After that, by carrying out the same step as the step as shown in FIGS. 19 to 21, the same liquid crystal display device as the liquid crystal display device as shown in FIGS. 15 and 16 can be gained.

As shown in FIG. 22, since no resist film is formed at the time of the injection of phosphorous ions 33 for forming the n$^+$ type impurity regions 3a to 3f, the effects gained by a process for a liquid crystal display device according to the second embodiment of the present invention as shown in FIG. 4 can be gained in addition to the effects gained by a process for a liquid crystal display device according to the fourth embodiment of the present invention.

(Sixth Embodiment)

Figure 23:
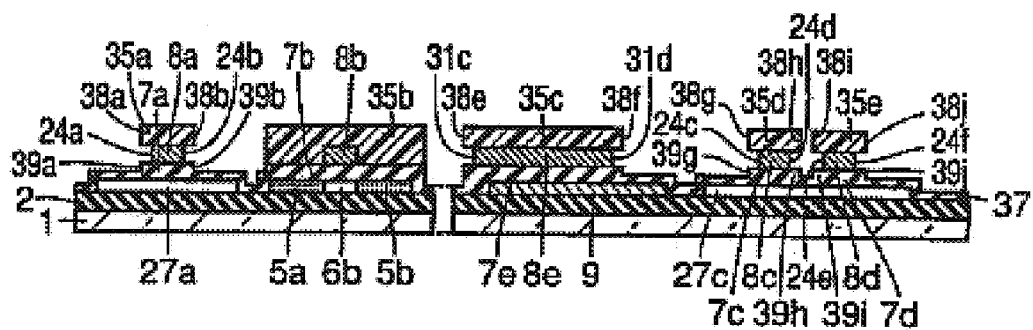
FIGS. 23 to 25 are cross section schematic views for describing the first to the third steps of a process of a sixth embodiment of a liquid crystal display device according to the present invention.
Figure 24:
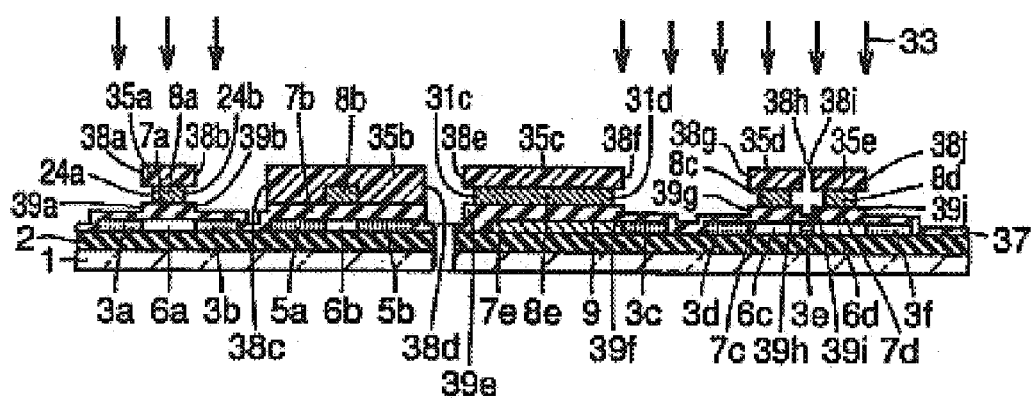
Figure 25:
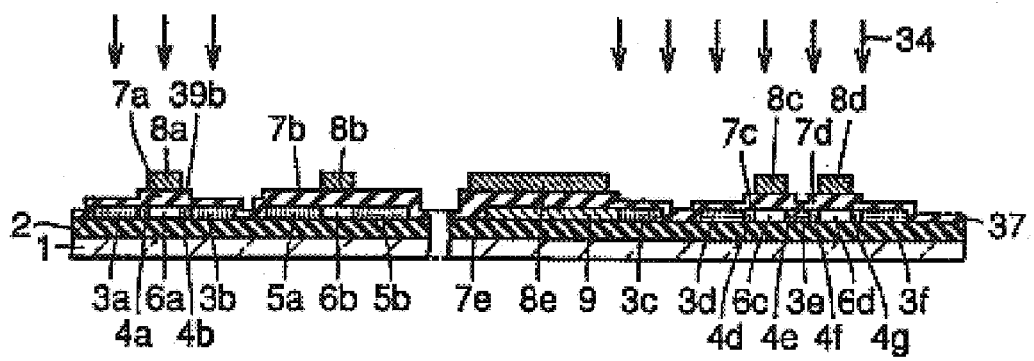

Referring to FIGS. 23 to 25, a process for a liquid crystal display device according to the sixth embodiment of the present invention is described.

First, after carrying out the step as shown in FIGS. 10 and 11 of a process for a liquid crystal display device according to the third embodiment of the present invention, resist films 35a to 35e (see FIG. 23) is formed. Then, by using the resist films 35a to 35e as a mask gate electrodes 8a, 8c and 8d and a capacitor electrode 8e are formed by utilizing the same step as the step as shown in FIG. 2. After that, by carrying out the same step as the step as shown in FIG. 17, the extended parts 39a, 39b, 39g to 39j (see FIG. 17) of the gate insulating film and insulating film parts which extend outside of the extended parts 39a, 39b, 39g to 39j are formed. In this manner, the structure as shown in FIG. 23 is gained.

Next, as shown in FIG. 24, phosphorous ions 33 are injected into predetermined regions by using the same conditions as the injection conditions for phosphorous ions in the as shown in FIG. 18. In this manner, the n$^+$ type impurity regions 3a to 3f are formed. After this, the resist films 35a to 35e are removed.

Next, as shown in FIG. 25, by injecting phosphorous ions 34 into predetermined regions using the gate electrodes 7a, 7c and 7d as a mask, n$^-$ type impurity regions 4a, 4b, 4d to 4g are formed. As for the injection conditions for these phosphorous ions 34, the injection energy can be 6.4×10$^{-15}$J(40 keV) and the injection density can be 1×10$^{14}$ cm$^{-2}$ or less. After that, by carrying out the same step as the step carried out after the step as shown in FIG. 14, the same liquid crystal display device as the liquid crystal display device as shown in FIGS. 15 and 16 can be easily gained.

According to a process for a liquid crystal display device as shown in FIGS. 23 to 25, the effects due to the extended insulating film 37 as insulating film parts on the n$^+$ type impurity regions 3a to 3f, which have been described in the process for a liquid crystal display device according to the fourth embodiment of the present invention, can be gained in addition to the effects gained by the process for a liquid crystal display device according to the third embodiment of the present invention.

(Seventh Embodiment)

Figure 26:
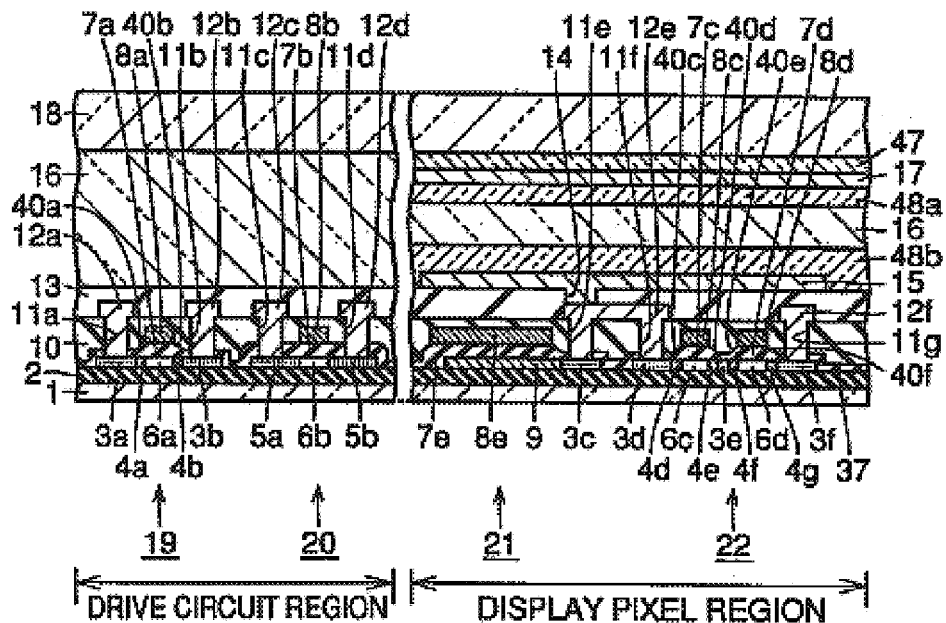
FIG. 26 is a cross section schematic view showing a seventh embodiment of a liquid crystal display device according to the present invention.
Figure 27:
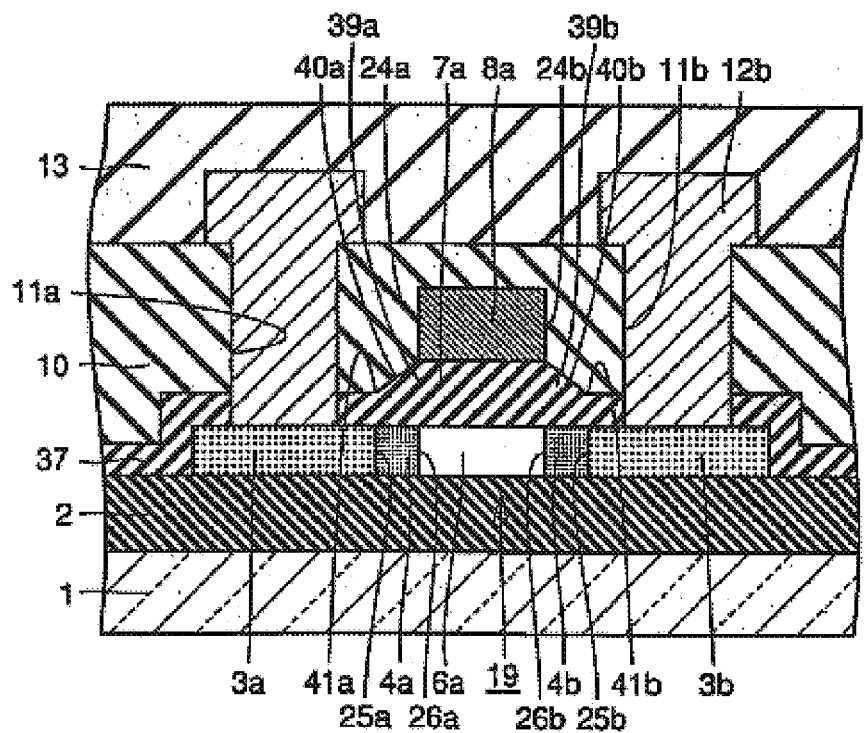
FIG. 27 is a partially enlarged cross section schematic view of the liquid crystal display device as shown in FIG. 26.

Referring to FIGS. 26 and 27, the seventh embodiment of a liquid crystal display device according to the present invention is described. Referring to FIGS. 26 and 27 the liquid crystal display device has basically the same structure as the liquid crystal display device as shown in FIGS. 15 and 16. Here, in the liquid crystal display device as shown in FIGS. 26 and 27, inclining sidewalls 40a to 40f are formed so as to incline with respect to the main surface of the glass substrate 1 in the gate insulating films 7a, 7c and 7d. Then, as shown in FIG. 27, the border parts 25a and 25b between the n$^+$ type impurity regions 3a, 3b and the n$^-$ type impurity regions 4a, 4b are located in the regions positioned beneath the terminal ends 41a, 41b of the inclining sidewalls 40a, 40b.

By having such a structure, in the liquid crystal display device as shown in FIGS. 26 and 27, in addition to the effects gained by the liquid crystal display device according to the fourth embodiment of the present invention as shown in FIGS. 15 and 16, the impurity concentration in the n$^-$ type impurity regions 4a, 4b can be made to have a distribution so as to gradually become larger in relation to the distance away from the gate electrode 8a referring to FIG. 27 since impurities are injected into predetermined regions via the extended parts 39a, 39b which have the above inclining sidewalls 40a, 40b at the time of forming the n$^-$ type impurity regions 4a, 4b as explained in a process described later. This is because of the following reasons. That is to say, in regions relatively close to the gate electrode 8a, the film thickness of the extended parts 39a, 39b becomes relatively large and, therefore, the amount of phosphorous ions, which reach the regions where the n$^-$ type impurity regions 4a, 4b are to be formed, can be made relatively small. On the other hand, the film thickness of the extended parts 39a, 39b in the regions relatively distant from the gate electrode 8a become relatively thin and, therefore, the amount of injected phosphorous ions which reach the n$^-$ type impurity region 4a, 4b located beneath parts of the extended parts 39a, 39b which are relatively distant from this gate electrode 8a can be made relatively large. Since such a concentration distribution of phosphorous ions can be created, the electric field concentration can be prevented without fail in the n$^-$ type impurity regions 4a, 4b. As a result of this, the reliability of the n type thin film field effect transistor 19 can be increased. Therefore, by applying the n type thin film field effect transistor 19 with such a high reliability to a drive circuit of the liquid crystal display device, to a switching circuit of the display pixel region, or the like, the display characteristics of the liquid crystal display device can be stabilized and made uniform without fail.

FIGS. 28 to 32 are cross section schematic views for describing a process for a liquid crystal display device as shown in FIGS. 26 and 27. Referring to FIGS. 28 to 32, a process for a liquid crystal display device is described.

Figure 28:
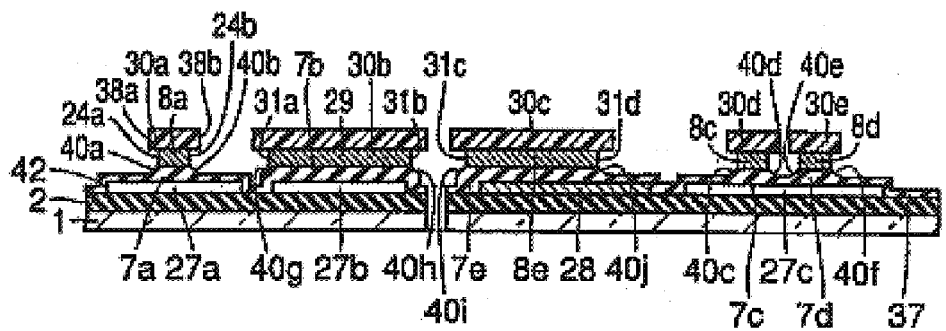
FIGS. 28 to 32 are cross section schematic views for describing the first to the fifth steps of a process for the liquid crystal display device as shown in FIGS. 26 and 27.

Referring to FIG. 28, first almost the same step as the step as shown in FIG. 17 is carried out. Here, in this case, as for etching at the time of partially removing the insulating film 37, for example, isotropic etching using a buffered hydrofluoric acid is carried out. As a result of this, as shown in FIG. 28, inclined sidewalls 40a to 40j can be formed.

Figure 29:
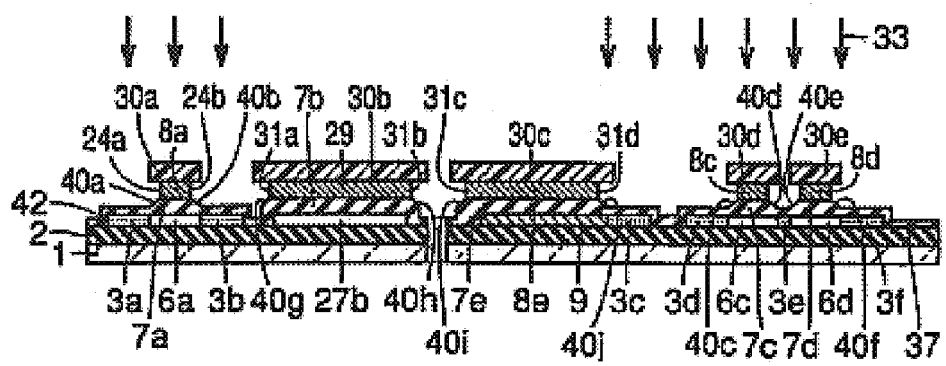
Figure 33:
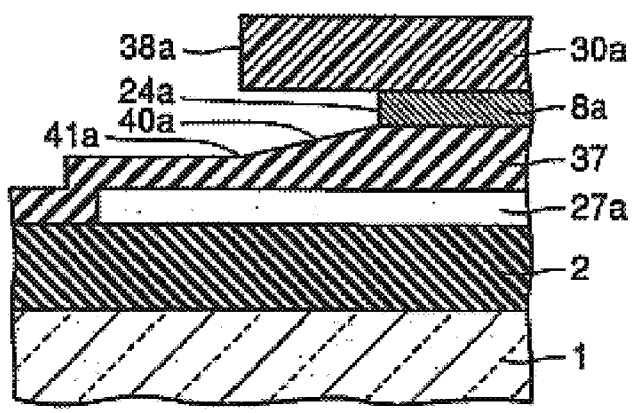
FIG. 33 is a partially enlarged cross section schematic view for describing the step as shown in FIG. 29.

Next, as shown in FIG. 29, by injecting phosphorous ions 33, n$^+$ type impurity regions 3a to 3f are formed. At this time, referring to FIGS. 33 and 34, since the resist film 30a is used as a mask, high concentration phosphorous ions are injected into the regions of the polysilicon film 27a which are located outside of the sidewall 38a of this resist film 30a. Here, FIG. 33 is a partially enlarged portion of the cross section schematic view for describing the step as shown in FIG. 29 and is a partially enlarged portion of the cross section schematic view of the region wherein the n type thin film field effect transistor 19 of FIG. 29 is formed.

Here, as for the injection conditions for phosphorous ions in FIG. 29, the conditions can be used wherein the injection energy is 4.8 to 6.4×10$^{-15}$J(30 to 40 keV) and the injection density is 1 to 5×10$^{-15}$ cm$^{-2}$.

Figure 30:
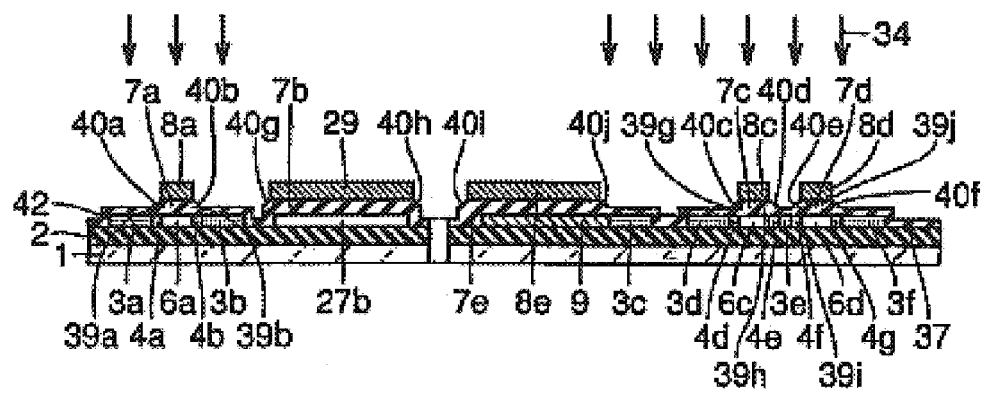

After that, the resist film 30a to 30e is removed. Then, as shown in FIG. 30, by injecting phosphorous ions 34, n⁻ type impurity regions 4a, 4b, 4d to 4g are formed in the regions positioned beneath the extended parts 39a, 39b, 39g to 39j. As for the injection conditions at this time, the conditions can be used wherein, for example, the injection energy is $8.0 \times 10^{-15}$ J(50 keV) and the injection density is $1 \times 10^{14}$ cm$^{-2}$ or less.

Figure 34:
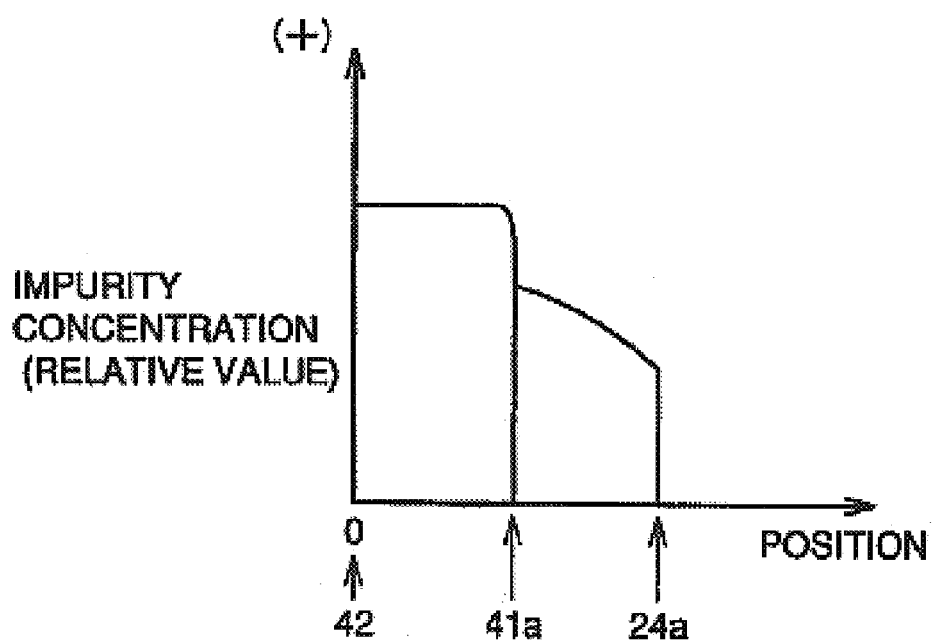
FIG. 34 is a schematic graph showing the relationship between the impurity concentration of $n^+$ type impurity regions 3a and $n^-$ type impurity regions 4a and the position of the implanted regions.

Then, at this time, since the inclined sidewalls 40a to 40f are formed in the extended parts 39a, 39b, 39g to 39j, as shown in FIG. 34, for example, the impurity concentration in the n⁻ type impurity region 4a is made such that the impurity concentration is the smallest in the region positioned beneath the sidewall 24a of the gate electrode 8a (see FIG. 33) and becomes gradually larger in relation to the closeness to the position of the terminal end 41a of the inclined sidewall 40a and the distance away from the sidewall 24a. In this manner, by utilizing the inclined sidewalls 40a to 40f, the n⁻ type impurity regions 4a, 4b, 4d to 4g, of which the impurity concentrations become gradually larger in accordance with the distance away from the gate electrode, can be easily formed.

In addition, in the case that the n⁻ type impurity regions 4a, 4b, 4d to 4g, which have such impurity distributions, are formed, the electric field concentration in those n⁻ type impurity regions can be effectively prevented as described referring to FIGS. 26 and 27.

Figure 31:
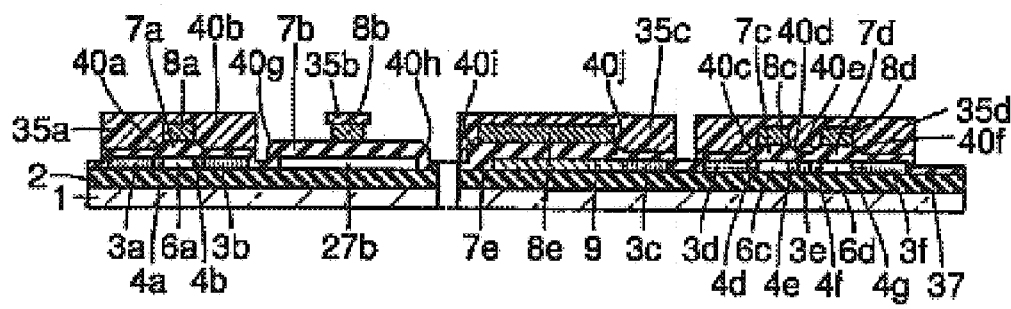

Next, as shown in FIG. 31, the resist films 35a to 35d are formed. In the step as shown in this FIG. 31, basically the same step as the step shown in FIG. 20 is carried out. In this manner, the gate electrode 8b is formed. After this, the resist films 35a to 35d are removed.

Figure 32:
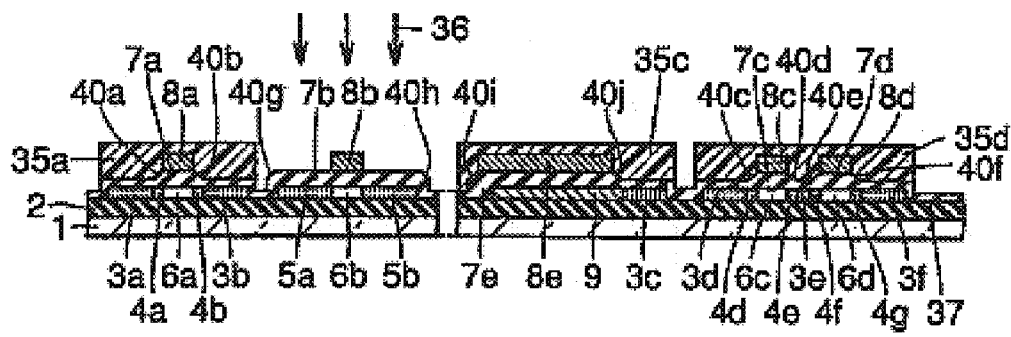

After that, as shown in FIG. 32, the resist films 35a, 35c, 35d are formed in the regions other than the region where the p type field effect transistor 20 is formed. After that, in the same manner as in the step shown in FIG. 21, p type impurity regions 5a and 5b are formed by injecting boron ions 36.

After that, by carrying out the same step as the step carried out after the step as shown in FIG. 21 in the fourth embodiment of the present invention, the liquid crystal display device as shown in FIGS. 26 and 27 can be easily gained.

According to the steps as shown in FIGS. 28 to 32, in addition to the above described effects, the same effects as the effects gained by the process for a liquid crystal display device in the fourth embodiment of the present invention can also be gained.

Figure 35:
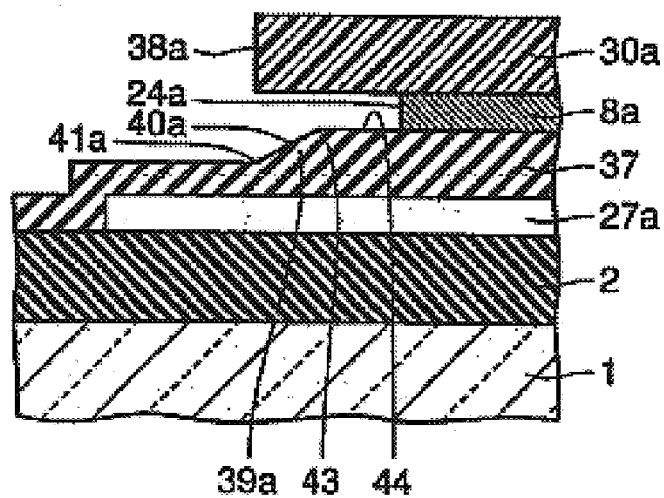
FIG. 35 is a partially enlarged cross section schematic view for describing a modified example of the process for a liquid crystal display device according to the seventh embodiment of the present invention.

Here, in the step as shown in FIG. 28, by adjusting the etching conditions at the time of etching the insulating film 37, it becomes possible to form the extended part 39a so as to be provided with the insulating film upper surface 44 and the inclined sidewall 40a as shown in FIG. 35. FIG. 35 is partially enlarged cross section schematic view for describing a modified example of the process for a liquid crystal display device in the seventh embodiment of the present invention and shows a modified example of the step as shown in FIG. 28. Referring to FIG. 35, the inclined sidewall 40a and the insulating film upper surface 44 are connected in the inclined sidewall upper edge 43. Then, the inclined sidewall 40a is connected, at the inclined sidewall terminal end 41a, to the upper surface of a part of the insulating film 37 which is located on a region of the polysilicon film 27a which is to become the n⁺ type impurity region 3a (see FIG. 27).

Figure 36:
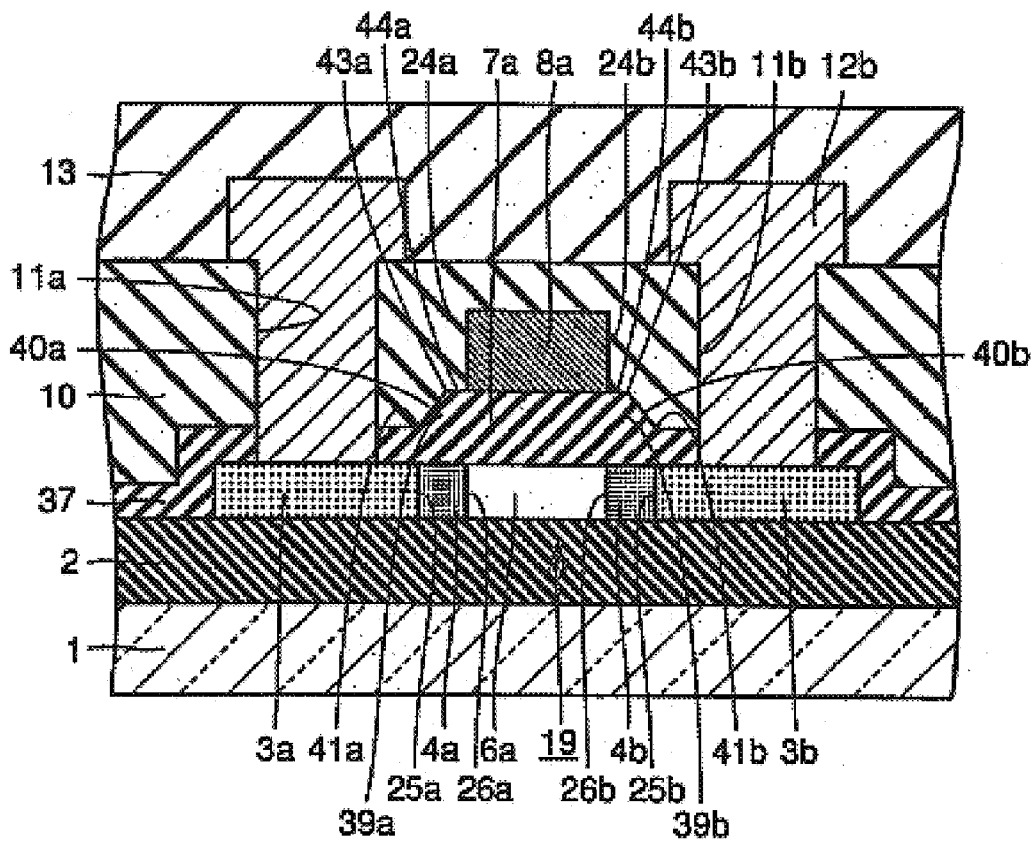
FIG. 36 is a partially enlarged cross section schematic view of a liquid crystal display device formed by using the step as shown in FIG. 35.

By carrying out an etching step for gaining a structure as shown in FIG. 35, a liquid crystal display device as shown in FIG. 36 can be gained. FIG. 36 is a partially enlarged cross section schematic view of a liquid crystal display device formed by using the step as shown in FIG. 35, which corresponds to FIG. 27. Referring to FIG. 36, though the liquid crystal display device basically has the same structure as that of the liquid crystal display device as shown in FIG. 27, the extended parts 39a, 39b of the gate insulating film 7a, respectively, have the insulating film upper surfaces 44a, 44b and the inclined sidewalls 40a, 40b. Then, the inclined sidewalls 40a, 40b are connected, respectively, to the insulating film upper surface 44a, 44b at the inclined sidewall upper edges 43a, 43b. In addition, the inclined sidewalls 40a, 40b are connected to the upper surface of the insulating film parts positioned above the n⁺ type impurity regions 3a, 3b at the inclined sidewall terminal edges 41a, 41b. Then, the border parts 25a, 25b between the n⁺ type impurity regions 3a, 3b and the n⁻ type impurity regions 4a, 4b are located in the regions located below these inclined sidewall terminal edges 41a, 41b.

The liquid crystal display device of the structure as shown in FIG. 36 can also gain the same effects as the effects gained by the liquid crystal display device as shown in FIGS. 26 and 27.

(Eighth Embodiment)

Figure 37:
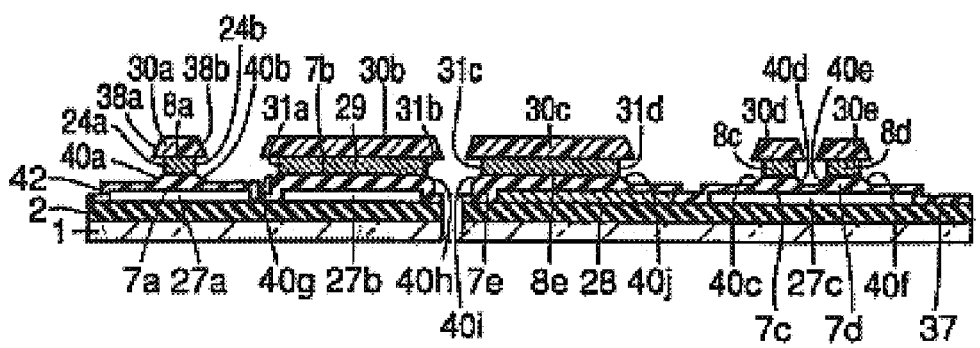
FIG. 37 is a cross section schematic view for describing a process of an eighth embodiment for a liquid crystal display device according to the present invention.

Referring to FIG. 37, a process for a liquid crystal display device according to the eighth embodiment of the present invention is described.

FIG. 37 corresponds to the step as shown in FIG. 28 of the process for a liquid crystal display device in the seventh embodiment of the present invention. Then, though the steps up to the formation of the gate electrodes 8a, 8c, 8d, a capacitor electrode 8e and a conductive film 29, the step of forming inclined sidewalls 40a to 40f are different. That is to say, while isotropic etching is used for forming these inclined sidewalls 40a to 40f in the step as shown in FIG. 28, a resist receding method is used in the step as shown in FIG. 37. Here, the resist receding method is a method as follows. That is to say, at the time when the insulating film 37 is etched anisotropically an etching gas, with which O₂ gas for example is mixed, is used so that the resist film 30a to 30e can be etched at the same time and, thereby, the resist films 30a to 30e are gradually etched at the same time as the insulating film 37 is etched. As a result of this, the resist films 30a to 30e gradually become smaller at the time when the insulating film 37 is etched. Then, as this resist films 30a to 30e become smaller, the region, which are etched in the insulating film 37, gradually becomes broader. Then, in the insulating film 37 parts can be formed wherein the time of receiving etching changes sequentially and, as a result, the inclined sidewalls 40a to 40f can be formed.

Figure 38:
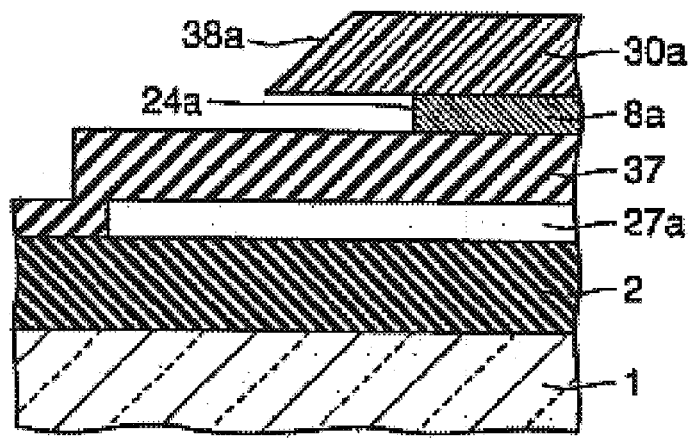
FIG. 38 is a partially enlarged cross section schematic view of a liquid crystal display device for describing the step as shown in FIG. 37.
Figure 39:
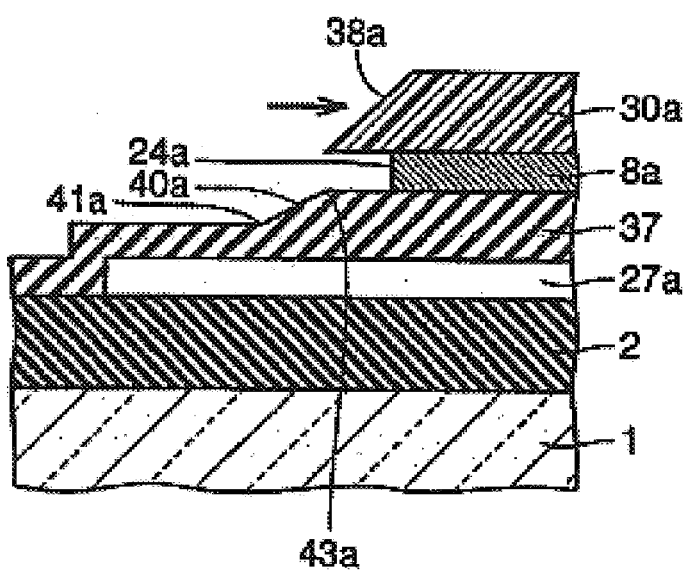
FIG. 39 is a partially enlarged cross section schematic view of a liquid crystal display device for describing the step as shown in FIG. 37.

This resist receding method is described referring to FIGS. 38 and 39. FIGS. 38 and 39 are partially enlarged cross section schematic views of the liquid crystal display device for describing the step as shown in FIG. 37. FIG. 38 shows the condition before the insulating film 37 receives etching using the resist receding method. FIG. 39 shows the condition after the insulating film 37 is partially removed through etching using the resist receding method. Referring to FIG. 38, first, by carrying out exposure to the resist film 30a and bake processing, after the development processing, in advance, the sidewall 38a of the resist film 30a is inclined to a certain degree. Then, as described above, in the etching for removing the insulating film 37, the etching is carried out under the condition where the resist film 30a is removed to a certain degree. As a result of this, as shown in FIG. 39, the size of the resist film 30a becomes smaller by being partially removed through etching. As a result, as this resist film 30a becomes smaller (recedes), the region receiving the etching of the insulating film 37 gradually spreads to the gate electrode 8a side. Then, in the insulating film 37, a region is gained where the time of receiving the etching changes sequentially. This region where the time of receiving the etching changes sequentially becomes the inclined sidewall 40a. The terminal edge 41a of the inclined sidewall 40a corresponds to the position of the edge part of the resist film 30a as shown in FIG. 38 before the etching is started while the position of the upper edge 43a of the inclined sidewall corresponds to the position of the terminal edge of the resist film 30a which has receded through etching as shown in FIG. 39.

In this manner, after the step as shown in FIG. 37, by carrying out the same steps as the steps as shown in FIGS. 29 to 32, a liquid crystal display device which has the same structure as that of the liquid crystal display device as shown in FIG. 36 can be gained.

Then, in the process for a liquid crystal display device according to the eighth embodiment of the present invention as shown in FIG. 37, in addition to the effects gained by the process for a liquid crystal display device according to the seventh embodiment of the present invention, it becomes possible to arbitrarily adjust the forms of the extended parts 39a to 39f such as in the inclined angles of the inclined sidewalls 40a to 40f or the dimensions of these inclined sidewalls 40a to 40f by modifying the etching conditions in a variety of ways in the resist receding method.

Figure 40:
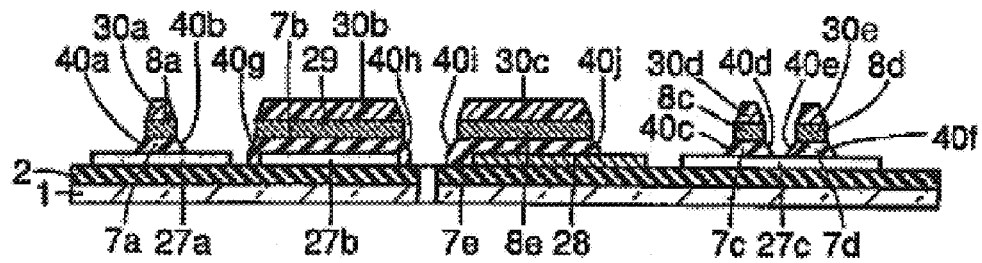
FIGS. 40 to 42 are cross section schematic views for describing the first to third steps of a modified example of the process for a liquid crystal display device as shown in FIG. 37.
Figure 41:
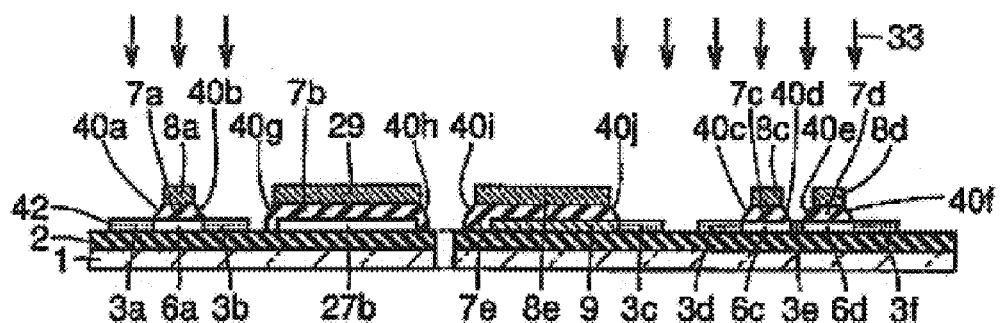
Figure 42:
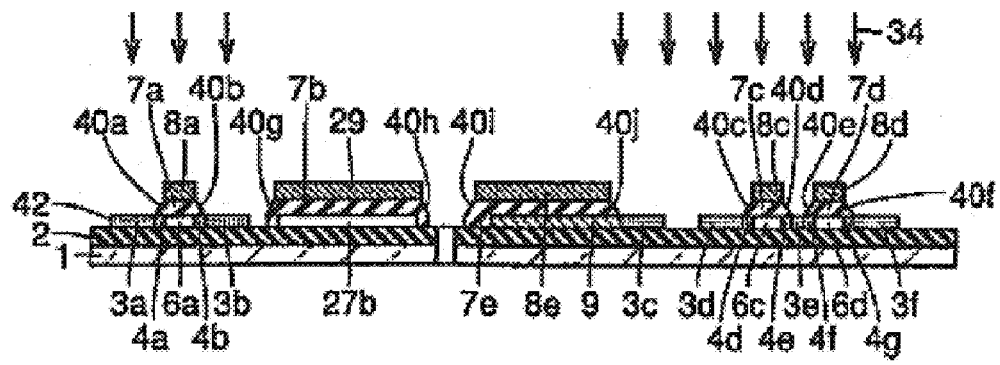

In addition, as a modified example of the process for a liquid crystal display device according to the eighth embodiment of the present invention as shown in FIG. 37, a method as shown in FIGS. 40 to 42 can be used. FIGS. 40 to 42 are cross section schematic views showing a modified example of the process for a liquid crystal display device according to the eighth embodiment of the present invention as shown in FIG. 37. Referring to FIGS. 40 to 42, the method for a liquid crystal display device is described.

Figure 43:
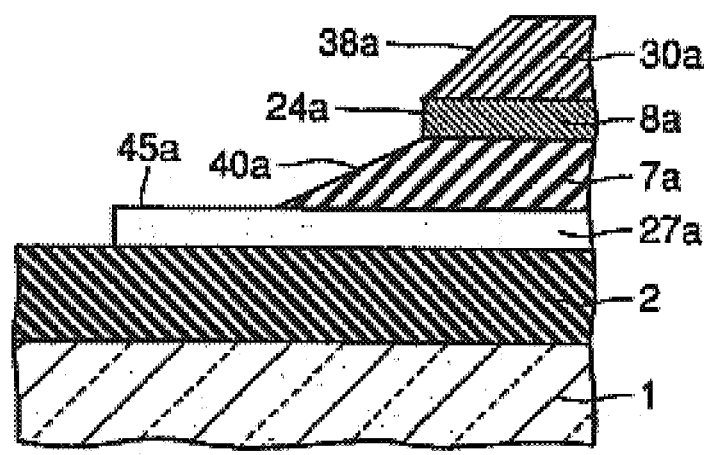
FIG. 43 is a partially enlarged cross section schematic view of the liquid crystal display device as shown in FIG. 40.

FIG. 40 is basically the same step as the step shown in FIG. 37. Here, in the step as shown in FIG. 40, the insulating film 37 (see FIG. 37) is almost completely removed from the regions of the polysilicon films 27a, 27c which are to become the $n^+$ type impurity regions 3a to 3f. This can be implemented by carrying out etching of the resist film 30a until the positions of the terminal edge of the resist film 30a and the sidewall 24a of the gate electrode 8a approximately agree by increasing the etching rate for removing the resist film 30a in the resist receding method as shown in FIG. 43. In this manner, the upper surface 45a of the polysilicon film 27a can be exposed. Here, FIG. 43 is a partially enlarged cross section schematic view of the liquid crystal display device as shown in FIG. 40.

After the step as shown in FIG. 40, the resist films 30a to 30e are removed. Then, as shown in FIG. 41, phosphorous ions 33 are injected by using the gate insulating films 7a, 7c and 7d as a mask and, thereby, the $n^+$ type impurity regions 3a to 3f are formed. The step as shown in this FIG. 41 basically corresponds to the step as shown in FIG. 9. Then, the injection conditions of phosphorous ions 33 in FIG. 41 are basically the same as the injection conditions of phosphorous ions 33 in FIG. 9.

After that, as shown in FIG. 42, phosphorous ions 34 are injected by using the electrodes 8a, 8c, 8d as a mask and, thereby, the $n^-$ type impurity regions. 4a, 4b, 4d to 4g are formed. This step as shown in FIG. 42 basically corresponds to the step as shown in FIG. 6 and, as for the conditions for injecting these phosphorous ions 34, the injection conditions for injecting phosphorous ions 34 in the step as shown in FIG. 6 can be used.

After that, by carrying out the steps as shown in FIGS. 7 and 8, a liquid crystal display device which has almost the same structure as that of the liquid crystal display device as shown in FIGS. 26 and 27 can be gained. Here, in this liquid crystal display device formed by using the process as shown in FIGS. 40 to 42, the insulating film parts which are parts of the gate insulating films 7a, 7c, 7d do not extend onto the $n^+$ type impurity regions 3a to 3f.

Then, according to the process for a liquid crystal display device as shown in FIGS. 40 to 42, in addition to the effects gained by the process for a liquid crystal display device according to the second embodiment of the present invention, the effects gained by using the resist receding method described in the process for a liquid crystal display device as shown in FIG. 37 can be gained at the same time.

(Ninth Embodiment)

Figure 44:
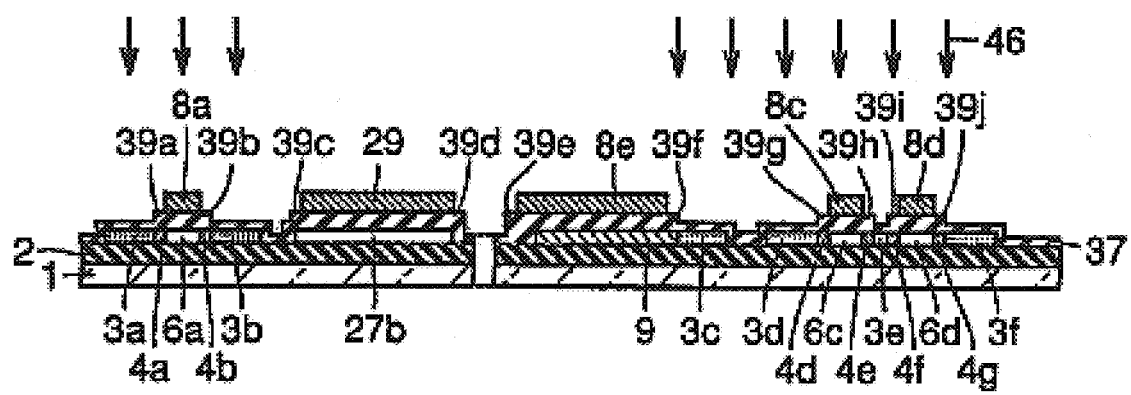
FIG. 44 is a cross section schematic view for describing a process of a ninth embodiment of a liquid crystal display device according to the present invention.

Referring to FIG. 44, a process for a liquid crystal display device according to the ninth embodiment of the present invention is described.

Figure 45:
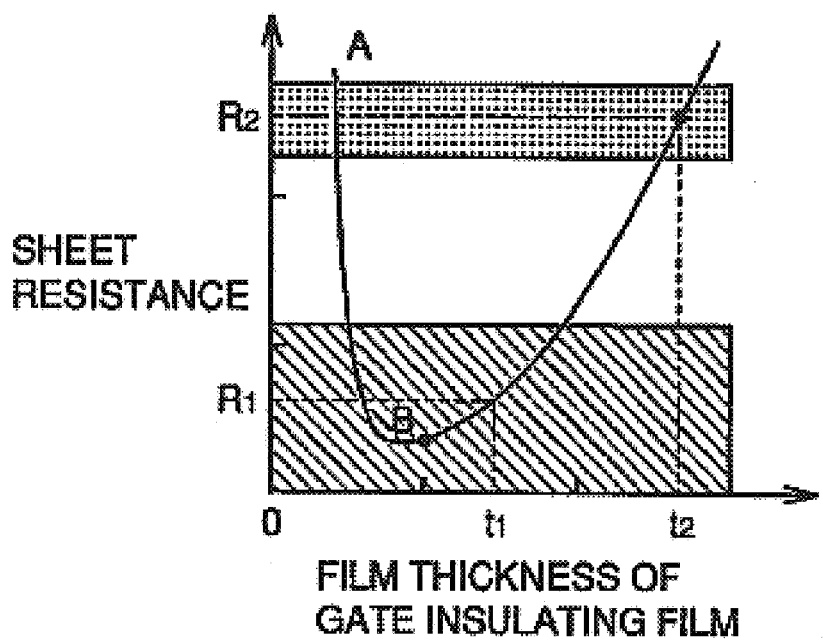
FIG. 45 is a schematic graph showing the relationship between the film thickness of the insulating film and the sheet resistance of the region which has received the implantation of impurities in the case that impurity ions are implanted via the insulating film under certain conditions.

First, after carrying out the step as shown in FIG. 17 of the process for a liquid crystal display device according to the fourth embodiment of the present invention, the resist films 30a to 30e (see FIG. 17) are removed. After that, as shown in FIG. 44, the $n^+$ type impurity regions 3a to 3f and the $n^-$ type impurity regions 4a, 4b, 4d to 4g are formed at the same time by injecting phosphorous ions 46. This utilizes the difference between the film thickness of the extended parts 39a, 39b, 39g to 39j and the film thickness of the insulating film parts located on the $n^+$ type impurity regions. This point is described referring to FIG. 45. FIG. 45 shows a schematic graph indicating the relationship between the film thickness of an insulating film and the sheet resistance of the region, which has received the injection of the impurities, in the case that impurity ions are injected under constant conditions via the insulating film. Referring to FIG. 45, the horizontal axis shows the film thickness of the insulating film and the vertical axis shows the sheet resistance value of the region in which the impurity ions are injected. As can be seen from FIG. 45, in the case that impurity ions of the same energy are injected, it can be seen that the sheet resistance value of the region in which the impurity ions are injected changes by changing the film thickness of the insulating film which is formed on the implanted region. This is because the amount of impurity ions that reach the region into which the impurity ions are to be injected changes according to the film thickness of insulating film. Then, when the range of the sheet resistance value which is necessary as the $n^+$ type impurity region is denoted as region B while the range of the sheet resistance value which is necessary as the $n^-$ type impurity region is denoted as region A, the $n^+$ type impurity regions and the $n^-$ type impurity regions can be formed at the same time through the injection energy of single impurity ions by adjusting the film thickness of the insulating film and the conditions of the injected impurity ions. For example, in the case that the film thickness of the insulating film parts, located on the $n^+$ type impurity regions 3a to 3f, is assumed to be t1, as shown in FIG. 45, and the film thickness of the extended parts 39a, 39b, 39g to 39j is set as t2 in FIG. 45, the sheet resistance value of the $n^+$ type impurity region can be made to be R1 and the sheet resistance value of the n type impurity region can be made to be R2 when the injection energy of the impurity ions is properly selected.

That is to say, by adjusting the injection energy and injection density of the phosphorous ions 6 in FIG. 44 and the film thickness of the extended parts 39a, 39b,; 39g to 39j and the film thickness of the insulating film parts located on the regions which are to become n+ type impurity regions 3a to 3f, it becomes possible to form the n+ type impurity regions 3a to 3f and the n− type impurity regions 4a, 4b, 4d to 4g at the same time. For example, in the case that the film thickness of the extended parts 39a, 39b, 39g to 39j (film thickness of the gate insulating films 7a, 7c, 7d) is 80 nm and the film thickness of the insulating film parts located on the n+ type impurity regions 3a to 3f is 40 nm, the n+ type impurity regions 3a to 3f and the n− type impurity regions 4a, 4b, 4d to 4g which have predetermined sheet resistance values can be formed at the same time when the injection energy of the phosphorous ions 46 is $4.8 \times 10^{-15}$J(30 keV) and the injection density is $5 \times 10^{15}$ cm$^{-2}$.

Here, the injection conditions of these phosphorous ions 46 are adjustable in relation to the film thickness of the gate insulating films 6a, 6c, 6d, or the like, and can be selected from, for example, the injection energy in the range of from 4.8 to $6.4 \times 10^{-15}$J(30 to 40 keV) and from the injection density in the range of from 1 to $5 \times 10^{15}$ cm$^{-2}$.

Then, after the step as shown in FIG. 44, a liquid crystal display device which has the same structure as the liquid crystal display device as shown in FIGS. 15 and 16 can be easily gained by carrying out the steps as shown in FIGS. 20 and 21.

Then, according to the process for a liquid crystal display device as shown in FIG. 44, the same effects as the effects in the process for a liquid crystal display device according to the fifth embodiment as shown in FIG. 22 can be gained and, at the same time, the manufacturing steps of a liquid crystal display device can be simplified since one injection step of phosphorous ions can, further, be omitted from the process for a liquid crystal display device as shown in FIGS. 1 to 8. As a result, the manufacturing cost of a liquid crystal display device can be reduced.

(Tenth Embodiment)

Figure 46:
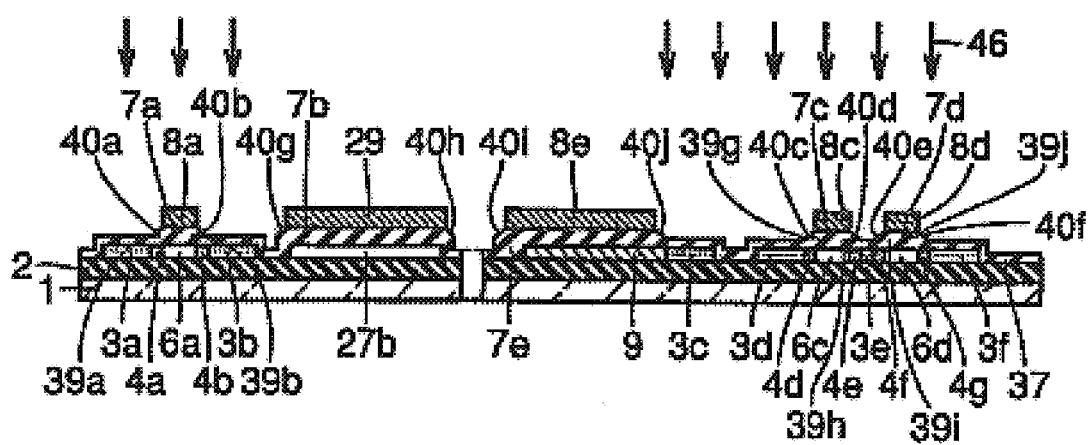
FIG. 46 is a cross section schematic view for describing a process of a tenth embodiment for a liquid crystal display device according to the present invention.
Figure 47:
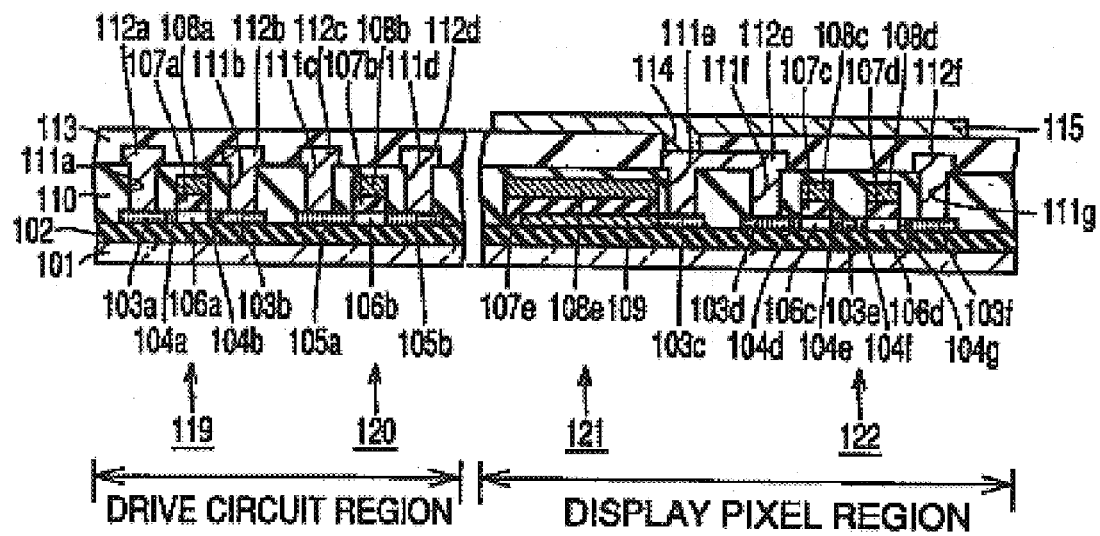
FIG. 47 is a cross section schematic view showing a liquid crystal display device according to a prior art.
Figure 48:
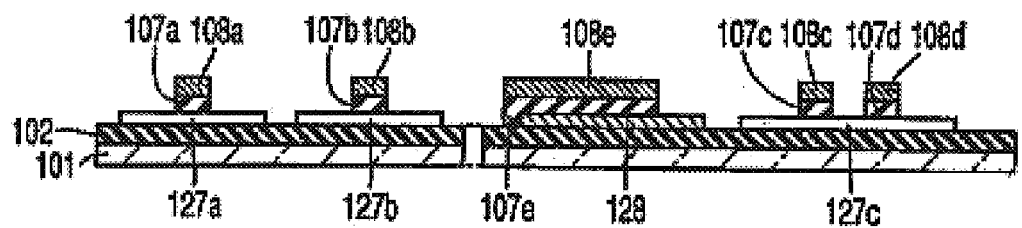
FIGS. 48 to 51 are cross section schematic views for describing the first to the fourth steps of the process for the liquid crystal display device according to a prior art as shown in FIG. 47.
Figure 49:
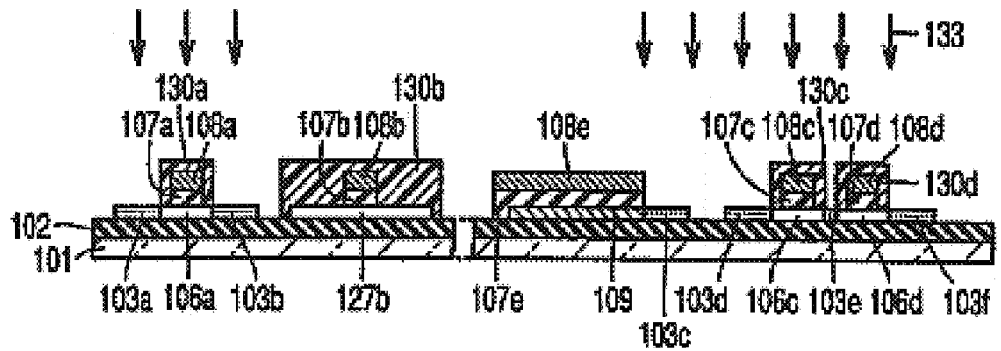
Figure 50:
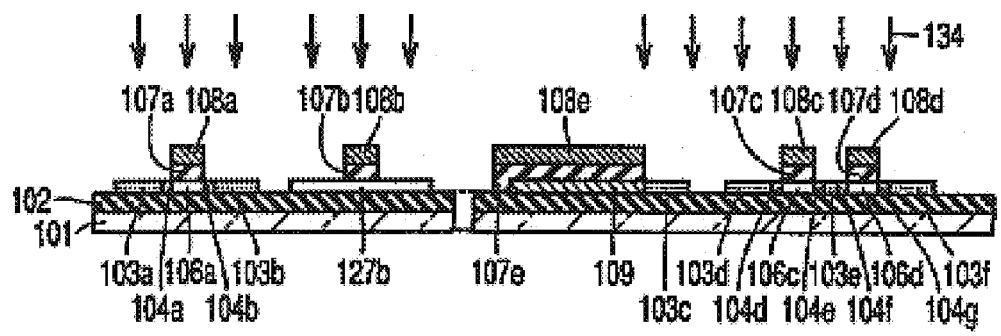
Figure 51:
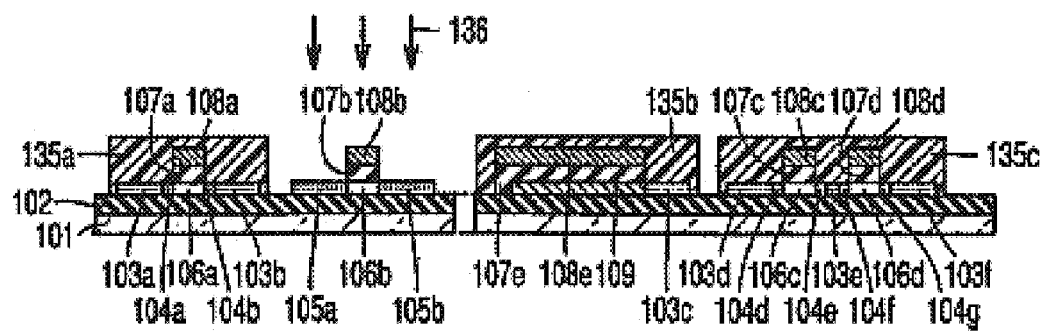
Figure 52:
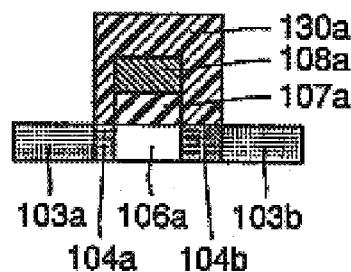
FIG. 52 is a schematic view for describing a problem in a prior art.
Figure 53:
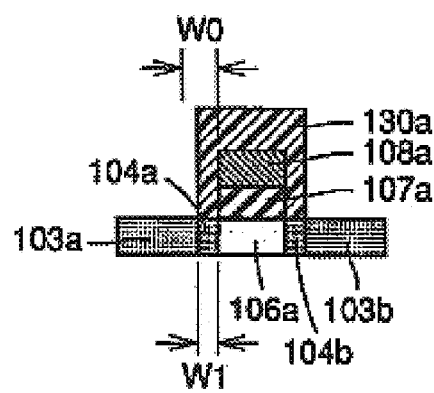
FIG. 53 is a schematic view for describing a problem in a prior art.
Figure 54:
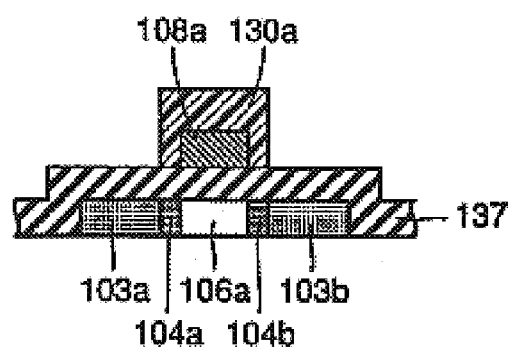
FIG. 54 is another schematic view for describing a problem in a prior art.

Referring to FIG. 46, a process for a liquid crystal display device according to the tenth embodiment of the present invention is described.

First, by carrying out the same steps as the steps as shown in FIG. 37, the extended parts 39a, 39b, 39g to 39j which have the inclined sidewalls 40a to 40f are formed by using a resist receding method. Here, by adjusting the etching conditions of the resist receding method, a structure is gained wherein the upper edges of the inclined sidewalls 40a to 40f are directly connected to the sidewalls of the gate electrodes 8a, 8c, 8d. Here, at the time of forming extended parts 39a, 39b, 39g to 39j which have these inclined sidewalls 40a to 40f, isotropic etching may be used in the same manner as in the seventh embodiment of the present invention.

After this, the resist films 30a to 30e (see FIG. 37) are removed. Then, as shown in FIG. 46, the n+ type impurity regions 3a to 3f and the n− type impurity regions 4a, 4b, 4d to 4g are formed at the same time by injecting phosphorous ions 46. This step, as shown in FIG. 46, corresponds to the step as shown in FIG. 44.

After that, by carrying out the same steps as the steps as shown in FIGS. 31 and 32, a liquid crystal display device which has the same structure as that of the liquid crystal display device as shown in FIGS. 26 and 27 can be easily gained. Then, according to the process for a liquid crystal display device as shown in FIG. 46, the same effects as the effects in the process for a liquid crystal display device as described in the ninth embodiment of the present invention can be gained and, simultaneously, the same effects as the effects gained by the process for a liquid crystal display device according to the seventh embodiment of the present invention as shown in FIGS. 28 to 32 can be gained.

Here, the steps as shown in the ninth embodiment and the tenth embodiment of the present invention can be applied to the processes for a liquid crystal display device as shown in the first to eighth embodiments of the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device including:

forming a semiconductor film on a substrate;

forming an insulating film on said semiconductor film;

forming a conductive film on said insulating film;

forming a first resist film, which has sidewalls, on said conductive film;

forming a first gate electrode, which has sidewalls inside of the sidewalls of said first resist film, and a separate portion of said conductive film, by partially removing said conductive film by etching, using said first resist film as a mask;

removing said first resist film;

forming high impurity concentration source and drain regions of a second conductivity type in regions of said semiconductor film on opposites sides of said first gate electrode by injecting impurities into said semiconductor film, using said first gate electrode and said separate portion of said conductive film as implantation masks, thereby forming a field effect transistor of the second conductivity type;

forming a second resist film covering said first gate electrode and said source and drain regions of the second conductivity type and part of said separate portion of said conductive film, said second resist film having sidewalls on said separate portion of said conductive film;

forming a second gate electrode, which has sidewalls inside the sidewalls of said second resist film, by partially removing said portion of said conductive film by etching, using said second resist film as a mask;

forming a gate insulating film, which includes extended parts having sidewalls positioned beyond the sidewalls of said second gate electrode, by partially removing said insulating film by etching, using said second resist film as a mask;

forming high impurity concentration source and drain regions of a first conductivity type in regions of said semiconductor film, spaced apart from the sidewalls of said extended part, by injecting impurities into said semiconductor film, using said second resist film as a mask;

removing said second resist film; and forming, after removing said second resist film, low impurity concentration regions of the first conductivity type in said semiconductor film respectively adjacent said source and drain regions of the first conductivity type, the low impurity concentration regions having an impurity concentration relatively lower than that of said high impurity concentration source and drain regions of the first conductivity type, in regions of said semiconductor film positioned beneath said extended parts of said gate insulating film, by injecting impurities into said semiconductor film, using said second gate electrode as a mask, thereby forming a field effect transistor of the first conductivity type.

2. The method of manufacturing a semiconductor device according to claim 1, wherein, in forming said gate insulating film, an insulating film part, thinner than said extended parts of said gate insulating film, is left on parts of the semiconductor film which are to become said high impurity concentration source and drain regions of the first conductivity type.

3. The method of manufacturing a semiconductor device according to claim 1, wherein the first conductivity type is n type second conductivity type is p type.

4. The method of manufacturing a semiconductor device according to claim 1, wherein, in forming said gate insulating film, inclining the sidewalls of said extended parts with respect to a main surface of said substrate.

5. The method of manufacturing a semiconductor device according to claim 4, wherein, in forming said gate insulating film, inclining the sidewalls of said extended parts with respect to the main surface of said substrate by partially removing said insulating film by isotropic etching.

6. The method of manufacturing a semiconductor device according to claim 4, wherein, in forming said gate insulating film, inclining the sidewalls of said extended parts with respect to the main surface of said substrate using a resist receding method.

7. A method of manufacturing a liquid crystal display device using a method of manufacturing a semiconductor device according to claim 1.

8. A method of manufacturing a semiconductor device including:

forming a semiconductor film on a substrate;

forming an insulating film on said semiconductor film;

forming a conductive film on said insulating film;

forming a first resist film, which has sidewalls, on said conductive film;

forming a first gate electrode, which has sidewalls inside of the sidewalls of said first resist film, and a separate portion of said conductive film, by partially removing said conductive film by etching, using said first resist film as a mask;

removing said first resist film;

forming high impurity concentration source and drain regions of a second conductivity type in regions of said semiconductor film on opposites sides of said first gate electrode by injecting impurities into said semiconductor film, using said first gate electrode and said separate portion of said conductive film as implantation masks, thereby forming a field effect transistor of the second conductivity type;

forming a second resist film covering said first gate electrode and said source and drain regions of the second conductivity type and part of said separate portion of said conductor film, said second resist film having sidewalls on said separate portion of said conductive film;

forming a second gate electrode, which has sidewalls inside the sidewalls of said second resist film, by partially removing said portion of said conductive film by etching, using said second resist film as a mask;

forming a gate insulating film, which includes extended parts having sidewalls positioned beyond the sidewalls of said second gate electrode, by partially removing said insulating film by etching, using said second resist film as a mask;

removing said second resist film;

forming high impurity concentration source and drain regions of a first conductivity type in regions of said semiconductor film, spaced apart from the sidewalls of said extended part, by injecting impurities into said semiconductor film, using said gate insulating film as a mask; and forming low impurity concentration regions of the first conductivity type in said semiconductor film respectively adjacent said source and drain regions of the first conductivity type, the low impurity concentration regions having an impurity concentration relatively lower than that of said high impurity concentration source and drain regions of the first conductivity type, in regions of said semiconductor film positioned beneath said extended parts of said gate insulating film, by injecting impurities into said semiconductor film, using said second gate electrode as a mask, thereby forming a field effect transistor of the first conductivity type.

9. The method of manufacturing a semiconductor device according to claim 8, including forming said high impurity concentration source and drain regions of the first conductivity type and said low impurity concentration regions of the first conductivity type simultaneously.

10. The method of manufacturing a semiconductor device according to claim 8, wherein, in forming said gate insulating film, an insulating film part, thinner than said extended parts of said gate insulating film, is left on parts of the semiconductor film which is are to become said high impurity concentration source and drain regions of the first conductivity type.

11. The method of manufacturing a semiconductor device according to claim 8, wherein the first conductivity type is n type second conductivity type is p type.

12. The method of manufacturing a semiconductor device according to claim 8, wherein, in forming said gate insulating film, inclining the sidewalls of said extended parts with respect to a main surface of said substrate.

13. The method of manufacturing a semiconductor device according to claim 12, wherein, in forming said gate insulating film, inclining the sidewalls of said extended parts with respect to the main surface of said substrate by partially removing said insulating film by isotropic etching.

14. The method of manufacturing a semiconductor device according to claim 12, wherein, in forming said gate insulating film, inclining the sidewalls of said extended parts with respect to the main surface of said substrate using a resist receding method.

15. A method of manufacturing a liquid crystal display device using a method of manufacturing a semiconductor device according to claim 8.

* * * * *

UNITED STATES PATENT AND TRADEMARK OFFICE
CERTIFICATE OF CORRECTION

PATENT NO.     : 6,808,964 B2                                              Page 1 of 1
DATED          : October 26, 2004
INVENTOR(S)    : Hayashi et al.

It is certified that error appears in the above-identified patent and that said Letters Patent is hereby corrected as shown below:

<u>Title page,</u>
Item [62], Related U.S. Application Data, should read -- Division of application No. 09/730,006 filed on Dec. 6, 2000, now abandoned. --.

Signed and Sealed this

Sixth Day of September, 2005

JON W. DUDAS
*Director of the United States Patent and Trademark Office*